(12) United States Patent
Hartner et al.

(10) Patent No.: US 7,468,307 B2
(45) Date of Patent: Dec. 23, 2008

(54) SEMICONDUCTOR STRUCTURE AND METHOD

(75) Inventors: Walter Hartner, Bad Abbach-Peising (DE); Andreas Meiser, Unterhaching (DE); Hermann Gruber, Wörth (DE); Dietrich Bonart, Bad Abbach (DE); Thomas Gross, Sinzing (DE)

(73) Assignee: Infineon Technologies AG, Munich (DE)

( * ) Notice: Subject to any disclaimer, the term of this patent is extended or adjusted under 35 U.S.C. 154(b) by 50 days.

(21) Appl. No.: 11/476,497

(22) Filed: Jun. 28, 2006

(65) Prior Publication Data

US 2007/0018195 A1 Jan. 25, 2007

(30) Foreign Application Priority Data

Jun. 29, 2005 (DE) .................. 10 2005 030 363

(51) Int. Cl.
*H01L 21/76* (2006.01)
(52) U.S. Cl. ................... 438/430; 438/434
(58) Field of Classification Search ............. 438/430, 438/434; 257/505, 508, 510, 520
See application file for complete search history.

(56) References Cited

U.S. PATENT DOCUMENTS

| 4,320,411 A |   | 3/1982 | Fukushima |
| 4,688,069 A | * | 8/1987 | Joy et al. ............. 257/397 |
| 4,733,287 A | * | 3/1988 | Bower ................. 257/508 |
| 4,745,081 A |   | 5/1988 | Beyer et al. |
| 4,792,834 A |   | 12/1988 | Uchida |
| 4,910,572 A | * | 3/1990 | Kameyama ........... 257/508 |
| 4,980,747 A |   | 12/1990 | Hutter et al. |
| 5,021,852 A |   | 6/1991 | Sukegawa et al. |
| 5,614,750 A |   | 3/1997 | Ellul et al. |
| 6,114,768 A |   | 9/2000 | Gaul et al. |
| 6,121,102 A |   | 9/2000 | Norstrom et al. |
| 2008/0012090 A1 |   | 1/2008 | Meiser et al. |

FOREIGN PATENT DOCUMENTS

| EP | 0112489 | 7/1984 |
| EP | 0499403 | 8/1992 |
| EP | 1353368 | 10/2003 |
| JP | 63-24672 | 2/1988 |
| JP | 63024672 | 2/1988 |

OTHER PUBLICATIONS

German Office Action for German Application No. 10 2006 029 682.6 mailed on Mar. 27, 2008 (9 pages).
De Pestel, F. et al., "Deep Trench Isolation for a 50V 0.35 um Based Smart Power Technology," IEEE, pp. 191-194 (2003).

* cited by examiner

*Primary Examiner*—Mark Prenty
(74) *Attorney, Agent, or Firm*—Dicke, Billig & Czaja, PLLC

(57) ABSTRACT

A semiconductor structure includes a semiconductor layer stack includes a semiconductor substrate of a first conductivity type, a heavily-doped buried layer of a second conductivity type, and a monocrystalline semiconductor layer of a third conductivity type formed on top of the semiconductor layer and the buried layer, a contact to the buried layer, the contact formed in a contact hole, and a lateral insulation of different portions of the semiconductor structure, the insulation formed in an isolation trench. A contact to the semiconductor substrate may be formed within the isolation trench.

15 Claims, 19 Drawing Sheets

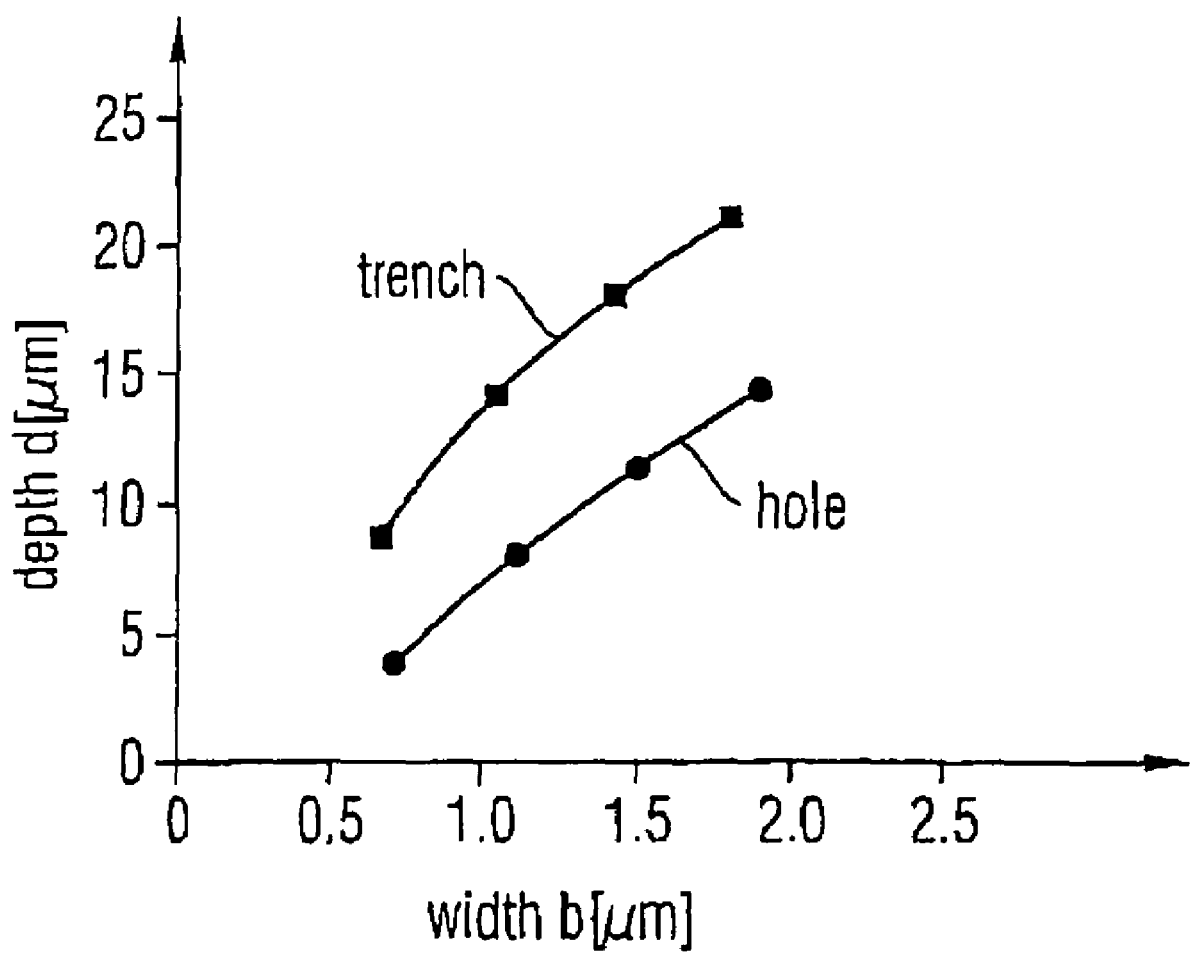

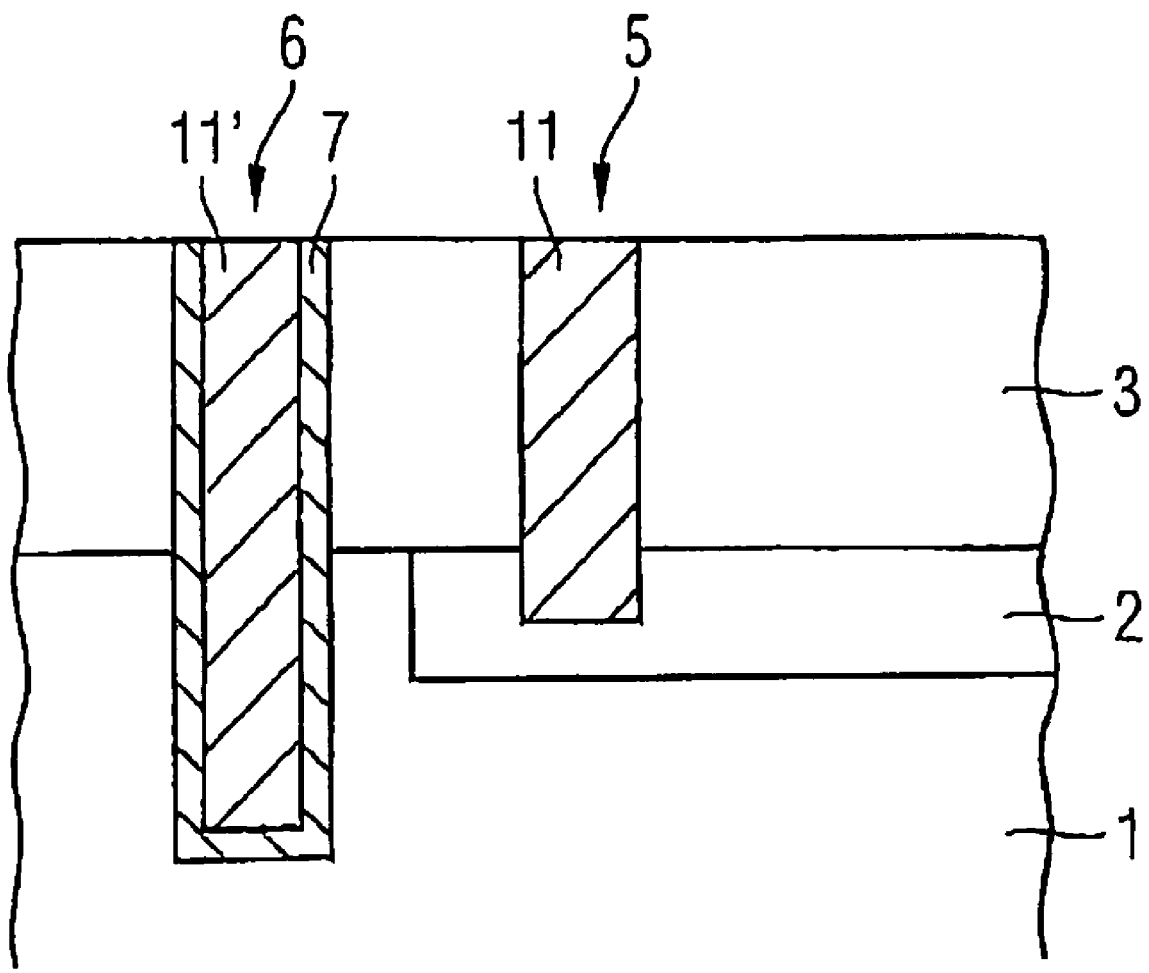

SEMICONDUCTOR STRUCTURE AND METHOD

CROSS-REFERENCE TO RELATED APPLICATIONS

This Utility Patent Application claims priority to German Patent Application No. DE 10 2005 030 363.3, filed on Jun. 29, 2005, which is incorporated herein by reference.

BACKGROUND

Integrated circuits generally include a plurality of circuit elements which have to be electrically insulated from each other. Some active components that are part of integrated circuits, for instance, Bipolar and DMOS transistors, use a heavily-doped buried layer as collector or drain region.

Present Smart Power Technology (SPT) products combine Bipolar, CMOS and DMOS circuit elements (also named as BCD technologies) on one chip. High requirements on the electrical strength, the current carrying capacity and the turn-on resistance $R_{on}$ are made. The insulation of separate circuit elements from each other has to have a high breakdown voltage $U_{BD}$. A homogeneous power distribution and a small turn-on resistance $R_{on}$ are important parameters for the contacts to the buried layer and to the substrate. At the same time, the insulation and the contact to the buried layer and to the substrate should be realized on a small surface area of the circuit.

At the beginning, the insulation and the contact to the buried layer and to the substrate were realized by diffusion regions which take up a large surface area and increase the thermal budget through the necessary temperatures during the formation process causing not-wanted diffusion processes into other layers.

The insulation and partly also the contact to the buried layer may be realized by etching trenches.

SUMMARY

One embodiment of the invention provides a semiconductor structure including a deep trench isolation and a deep trench buried layer contact and a method of manufacturing such a semiconductor structure. Further, one aspect of the invention provides a semiconductor structure including an isolation structure, a contact to a semiconductor substrate formed in isolation structure, and including a buried layer contact structure and a method of manufacturing such a semiconductor structure.

According to one aspect of the present invention a method of manufacturing includes:
  providing a semiconductor layer stack including a semiconductor substrate of a first conductivity type, a heavily-doped buried layer of a second conductivity type and a monocrystalline semiconductor layer of a third conductivity type formed on top of the semiconductor substrate and the buried layer, the monocrystalline semiconductor layer having an upper surface forming a surface of the semiconductor structure;
  forming a contact hole in the surface of the semiconductor structure so as to contact the buried layer, the contact hole having a first width and a first depth, the depth being measured from the surface of the semiconductor structure; and
  forming an isolation trench in the surface of the semiconductor structure so as to laterally insulate different portions of the semiconductor structure, the isolation trench having a second width and a second depth, the depth being measured from the surface of the semiconductor structure.

According to another aspect of the present invention a semiconductor structure includes:
  a semiconductor layer stack including a semiconductor substrate of a first conductivity type, a heavily-doped buried layer of a second conductivity type and a monocrystalline semiconductor layer of a third conductivity type formed on top of the semiconductor substrate and the buried layer, the monocrystalline semiconductor layer having an upper surface forming a surface of the semiconductor structure;
  a contact to the buried layer, the contact being formed in a contact hole, wherein the contact hole is formed in the surface of the semiconductor structure, and the contact hole having a first width and a first depth, the depth being measured from the surface of the semiconductor structure; and
  a lateral insulation structure for insulating different portions of the semiconductor structure, the insulation structure formed in an isolation trench, wherein the isolation trench is formed in the surface of the semiconductor structure, and the isolation trench having a second width and a second depth, the depth being measured from the surface of the semiconductor structure.

The dimensions, as for instance the length, the width and the depth, as well as the arrangement of the isolation trench and the contact hole can be adjusted to the layout of the whole semiconductor structure. In one embodiment, the lateral dimension of the hole defined vertically to the width of the hole is at least half and in the highest degree twice of the width of the hole. The length of the insulation trench that is the lateral dimension of the trench defined vertically to the width of the trench is more than twice of the width of the trench.

According to another aspect of the invention, a method of manufacturing a semiconductor structure includes:
  providing a semiconductor layer stack including a semiconductor substrate of a first conductivity type, a heavily-doped buried layer of a second conductivity type and a monocrystalline semiconductor layer of a third conductivity type formed on top of the semiconductor substrate and the buried layer, the monocrystalline semiconductor layer having an upper surface forming a surface of the semiconductor structure;
  forming an isolation trench in the surface of the semiconductor structure to laterally insulate different portions of the semiconductor structure, the isolation trench extending into the semiconductor substrate;
  providing an insulating layer at the side walls of the isolation structure, leaving the bottom portion of the isolation trench uncovered;
  providing a contact to the semiconductor substrate within the isolation structure;
  forming a contact structure in the surface of the semiconductor structure so as to contact the buried layer, the contact structure extending to the buried layer; and
  providing a contact to the buried layer within the contact structure.

According to another aspect of the invention, a semiconductor structure includes:
  a semiconductor layer stack including a semiconductor substrate of a first conductivity type, a heavily-doped buried layer of a second conductivity type and a monocrystalline semiconductor layer of a third conductivity type formed on top of the semiconductor substrate and the buried layer, the monocrystalline semiconductor layer having an upper surface forming a surface of the semiconductor structure;

a lateral insulation structure for insulating of different portions of the semiconductor structure, the insulation structure formed in an isolation trench, wherein the isolation trench is formed in the surface of the semiconductor structure and extends into the semiconductor substrate;

a contact to the semiconductor substrate formed within the isolation trench; and a contact to the buried layer, the contact to the buried layer being formed in a contact structure, wherein the contact structure is formed in the surface of the semiconductor structure and extends to the buried layer.

The dimensions, as for instance the length, the width and the depth, as well as the arrangement of the isolation trench and the contact structure can be adjusted to the layout of the whole semiconductor structure.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

FIG. 3 is a graphical illustration of the dependency of the etched depth on the width of contact holes and isolation trenches etched with the same process parameters.

FIG. 11C illustrates a schematical cross-section of the third embodiment of the semiconductor structure of one embodiment of the invention.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Referring to FIGS. 1 to 16, silicon is used as semiconductor material for substrate, buried layer and second semiconductor layer, and polysilicon is used as polycrystalline semiconductor material. Use of other semiconductor materials lies in the scope of the invention as long as appropriate material combinations thereof for electrical insulation and contacting are available.

Figure 1:
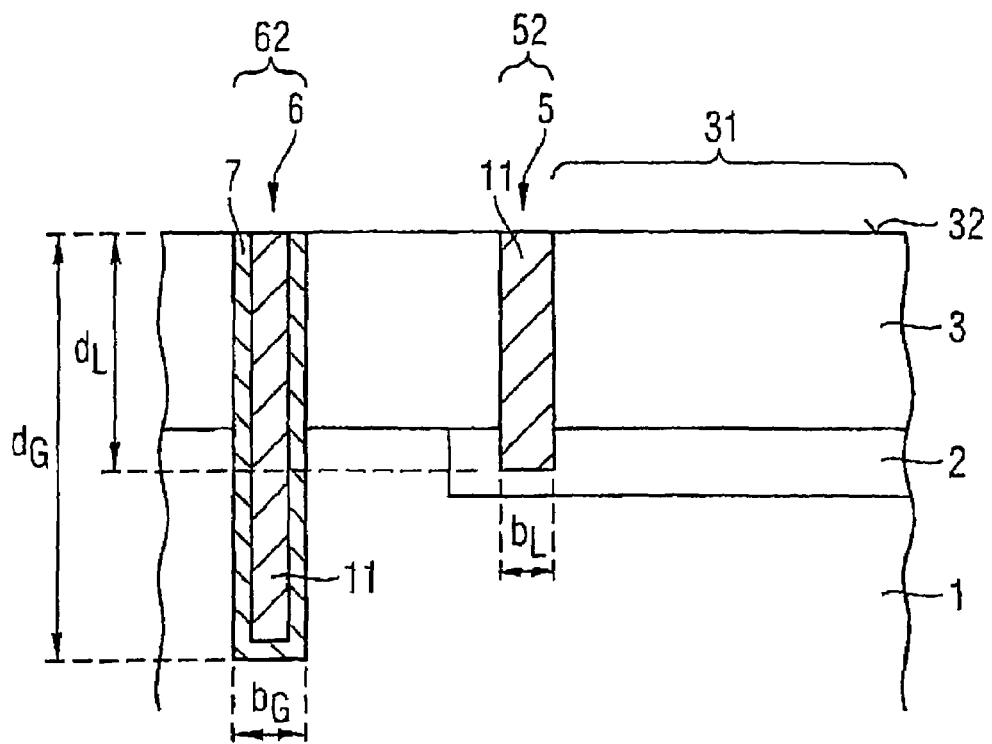
FIG. 1 illustrates a schematical cross-section of a first embodiment of the semiconductor structure of the invention.

FIG. 1 is a schematical cross-section of an embodiment of the semiconductor structure according to one embodiment of the invention. It illustrates a deep trench isolation 62 and a deep trench buried layer contact 52. A heavily-doped buried layer 2 of a second conductivity type is formed in a portion of an upper surface of a semiconductor substrate 1 of a first conductivity type by using a mask. A second semiconductor layer 3 of a third conductivity type is formed on the surface of semiconductor substrate 1 and on the surface of buried layer 2 by epitaxy. As a result, buried layer 2 is formed within a monocrystalline semiconductor material including semiconductor substrate 1 and monocrystalline layer 3. The portion of monocrystalline layer 3 on top of buried layer 2 forms an active area 31, in which circuit elements using the buried layer are formed. These elements or devices may be formed before or after carrying out the method according to one embodiment of this invention.

The semiconductor structure includes deep trench isolation 62 which laterally insulates different circuit elements from each other. The isolation 62 is formed in an isolation trench 6. Isolation trench 6 has a width $b_G$ and a depth $d_G$, the depth being measured from an upper surface 32 of monocrystalline semiconductor layer 3. Surface 32 forms a surface of the semiconductor structure. According to the embodiment of the semiconductor substrate illustrated in FIG. 1, the side walls and the bottom portion of trench 6 are covered by a dielectric (insulating) layer 7, and trench 6 is filled with a polycrystalline semiconductor material 11 of the second conductivity type. Since silicon is used as semiconductor material for substrate 1 and layers 2 and 3 as stated above, polycrystalline material 11 is of polysilicon.

The contact to buried layer 2 within a circuit element is formed by deep trench contact 52. Contact 52 is formed in a contact hole 5. Contact hole 5 has a width $b_L$ and a depth $d_L$, the depth $d_L$ being measured from surface 32. In the embodiment illustrated in FIG. 1, hole 5 is filled with polysilicon 11.

The buried layer may be formed on the whole upper surface of the semiconductor substrate, within the semiconductor substrate or within a portion of the semiconductor substrate by using a mask.

In one example, the width $b_G$ of the isolation trench is larger than the width $b_L$ of the contact hole. In one example, the depth $d_G$ of the isolation trench is larger than the depth $d_L$ of the contact hole.

For example, the trench for the insulation reaches into the semiconductor substrate. For example, the hole for the contact to the buried layer reaches at least to the surface of the buried layer.

According to the embodiment illustrated in FIG. 1, the depth of contact hole 5 has to be such that contact hole 5 reaches at least to that surface of buried layer 2 contacting semiconductor layer 3. Isolation trench 6 has to reach much deeper into semiconductor substrate 1 in order to realize a sufficient insulation of neighbouring circuit elements.

In the case, that the buried layer is formed on the whole surface of semiconductor substrate, the depth $d_G$ has to be specified such that the isolation trench completely disrupts (interrupts) the buried layer. To be more specific, the isolation trench has to extend below the lower surface of the buried layer.

Exemplary dimensions of the widths and depths of contact hole 5 and isolation trench 6 are: 0.1 to 3 μm for width $b_L$ of hole 5, 1 to 20 μm for depth $d_L$ of hole 5, 0.5 to 3 μm for width $b_G$ of trench 6, and 5 to 50 μm for depth $d_G$ of trench 6.

Other exemplary dimensions of the widths and depths of contact hole 5 and isolation trench 6 are: 1.0 to 1.5 μm for width $b_L$ of hole 5, 4 to 8 μm for depth $d_L$ of hole 5, 1.5 to 2.5 μm for width $b_G$ of trench 6, and 10 to 25 μm for depth $d_G$ of trench 6.

Further exemplary dimensions of the widths and depths of contact hole 5 and isolation trench 6 are: about 1.5 μm for width $b_L$ of hole 5, about 6 μm for depth $d_L$ of hole 5, about 2 μm for width $b_G$ of trench 6, and about 20 μm for depth $d_G$ of trench 6.

Figure 2:
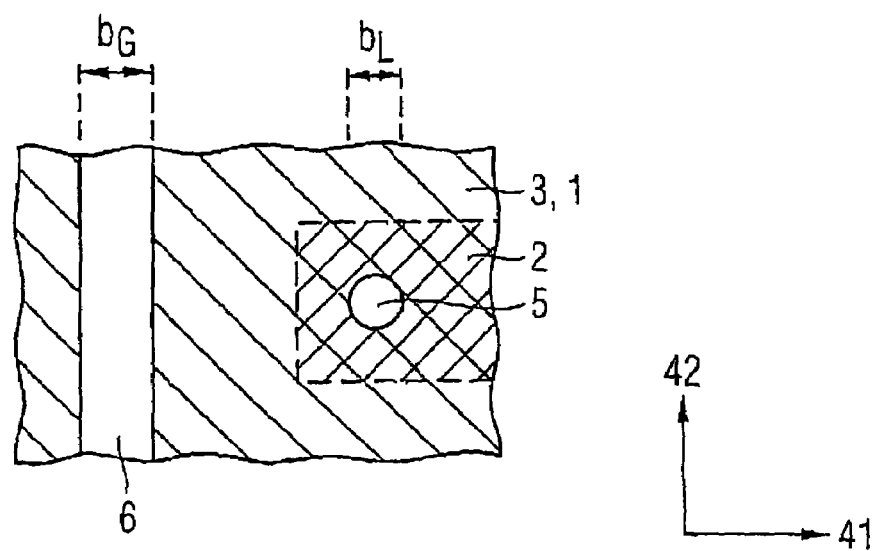
FIG. 2 illustrates a plan view on a semiconductor structure according to one embodiment of the invention.

FIG. 2 partly illustrates a plan view on a semiconductor structure according to one embodiment of the invention. An isolation trench 6 and a contact hole 5 for the contact to buried layer 2 are formed within the semiconductor structure including a semiconductor substrate 1, a buried layer 2 and a monocrystalline semiconductor layer 3. Buried layer 2 may also extend to trench 6 or even extend to the other side of trench 6.

In this case, trench 6 forms the border of buried layer 2 or disrupts buried layer 2. Contact hole 5 extends into direction 41 with a width $b_L$, and isolation trench 6 extends into direction 41 with a width $b_G$. The lateral dimension of hole 5, measured in direction 42, which is defined vertically to direction 41, is at least half of width $b_L$ and at maximum twice of width $b_L$. The length of isolation trench 6, i.e. the lateral dimension of trench 6 measured in direction 42, is more than twice of width $b_G$.

According to one embodiment of the method of manufacturing the semiconductor structure, contact hole 5 and isolation trench 6 are simultaneously formed by one etching process. FIG. 3 illustrates the dependency of the depth d of contact hole 5 or isolation trench 6, respectively, on the respective width b. The values of depth d are measured after etching a hole or a trench with typical process parameters being the same for etching holes and trenches. The different depths of holes and trenches are caused by different volumina of the holes and trenches. The difference in the volumina of a hole and a trench cause differences in the supply of the etching gases and in the removal of the reaction products and therefore cause different etching depths for the hole and the trench for the same process parameters. Therefore, only one etching step may be used to form a contact hole to a buried layer and a much deeper isolation trench.

As illustrated in FIG. 3, a ratio of the depth of hole 5 to the depth of trench 6 of about 0.7 was obtained for a width of hole 5 and trench 6 of 2 μm, respectively. The depths of hole 5 and trench 6 and the ratio of these depths may be adjusted to the requirements of the semiconductor structure by choosing suitable width of contact hole 5 and isolation trench 6. In one case, the ratio may be further decreased. The absolute values of etching depth are defined by the etching time.

Nevertheless, it is also possible to form the hole for the contact to the buried layer and the isolation trench separately in an arbitrary succession.

The method of manufacturing the semiconductor structure according to one embodiment of the invention is illustrated for silicon as the semiconductor material of the substrate, the buried layer, and the monocrystalline layer, but it may also be carried out for other semiconductor materials in the same way.

According to one embodiment of the invention, the method of manufacturing the semiconductor structure further includes selecting a suitable ratio of the width of the contact hole and the isolation trench. The etching depth of the trench can be increased compared to the etching depth of the hole by increasing the width of the trench compared to the width of the hole. Thus, the depth of the isolation trench being a parameter of the insulation properties can be adjusted to the requirements of the semiconductor structure.

In one example, the width of the isolation trench is larger than the width of the contact hole. Thus, a considerably larger etching depth of the isolation trench compared with that of the contact hole may be achieved making better insulation properties possible. Furthermore, a larger width of the isolation trench may be advantageous in some situations for depositing layers within the isolation trench in later processing steps. For instance, it is possible to completely fill the contact hole in a deposition process, while only conformally covering the surface of the isolation trench, that is the side walls and the bottom portion of the isolation trench, in the same process.

Figure 4A:
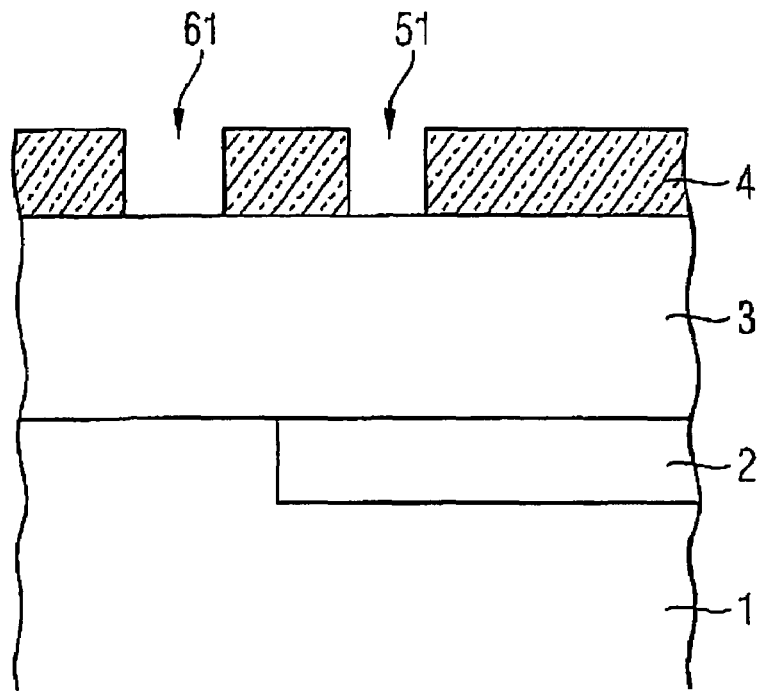
FIG. 4A illustrates a schematical cross-section of the semiconductor structure of FIG. 1 before etching the contact hole and the isolation trench according to an embodiment of the invention.

The processing steps are the same for some exemplary embodiments of the method of manufacturing the semiconductor structure and are illustrated in FIG. 4 by schematical cross-sections of the semiconductor structure. FIG. 4A illustrates a heavily-doped buried layer 2, which is formed in a semiconductor substrate 1. A monocrystalline semiconductor layer 3 is formed thereon. A hardmask 4 is formed on the semiconductor layer 3. Hardmask 4 may include a silicon nitride layer formed on top of semiconductor layer 3, an silicon oxide layer formed on top of the silicon nitride layer, and a polysilicon layer formed on top of the silicon oxide layer, by way of example, The silicon nitride layer is used as an etching stop for the removal of the upper oxide layer. The oxide layer and the polysilicon layer of hardmask 4 provide advantages in some embodiments with respect to side wall damages during etching of an isolation trench 6 and a contact hole 5. A hole 51 and a trench 61 are formed within hardmask 4 by a first lithography process and an anisotropic etching process. They may be formed simultaneously in one etching step.

Figure 4B:
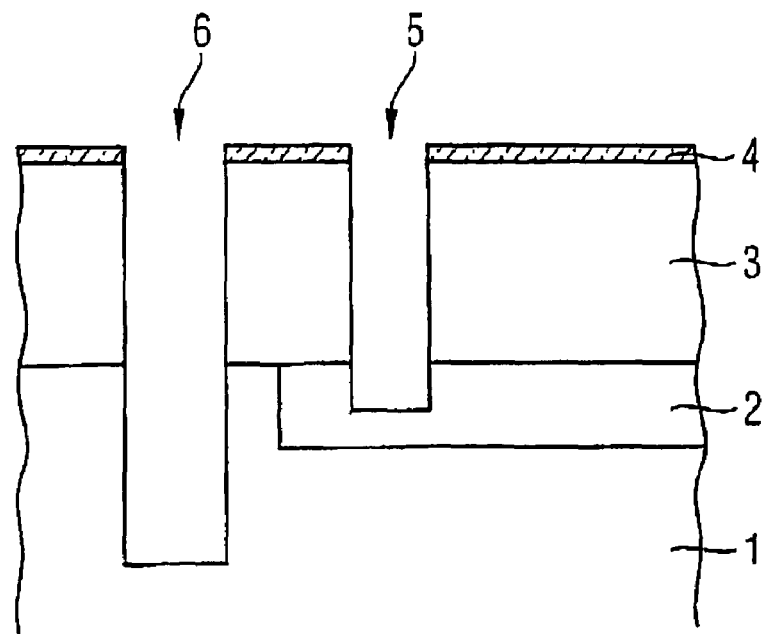
FIG. 4B illustrates a schematical cross-section of the semiconductor structure of FIG. 1 after etching the contact hole and the isolation trench according to an embodiment of the invention.

Subsequently, the patterns of hardmask 4 are transferred into semiconductor layer 3, buried layer 2 and substrate 1, respectively, by an anisotropic etching process, as illustrated in FIG. 4B. Hardmask 4 is partially etched such that only the silicon nitride layer exists after the etching process by way of example.

According to further embodiments of the invention, the hole for the contact to the buried layer and the trench for the insulation are filled, and a planar surface of the semiconductor structure is formed.

FIGS. 5 to 11 illustrate further processing steps of the method according to the invention for different embodiments by schematical cross-sections of the semiconductor structure.

Thick or thin dielectric (insulating) layers are deposited in subsequent processing of the semiconductor structure. In the following the term "thick dielectric layer" is used with respect to a dielectric layer with a typical thickness of 1 to 3 μm. The term "thin dielectric layer" is used with respect to a layer with a typical thickness of 50 to 1000 nm. In one case, the thickness of a thin dielectric layer is 700 nm.

Insulating layers may include thermal silicon oxide, silicon oxide deposited by a TEOS method, silicon nitride, silicon oxynitride, AlOx, ZrOx, TiOx and others or combinations thereof.

Figure 5A:
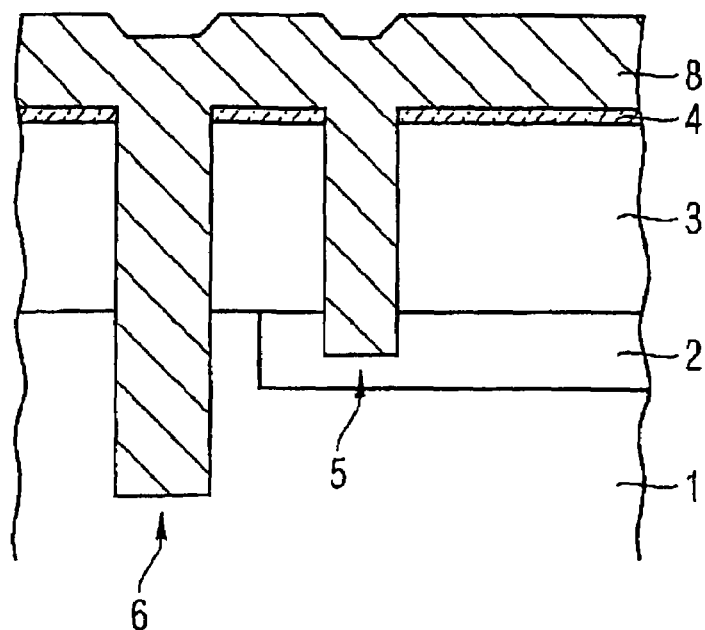
FIG. 5A illustrates a schematical cross-section of a second embodiment of the semiconductor structure of the invention at a first processing step according to a first embodiment of the method of the invention.
Figure 5B:
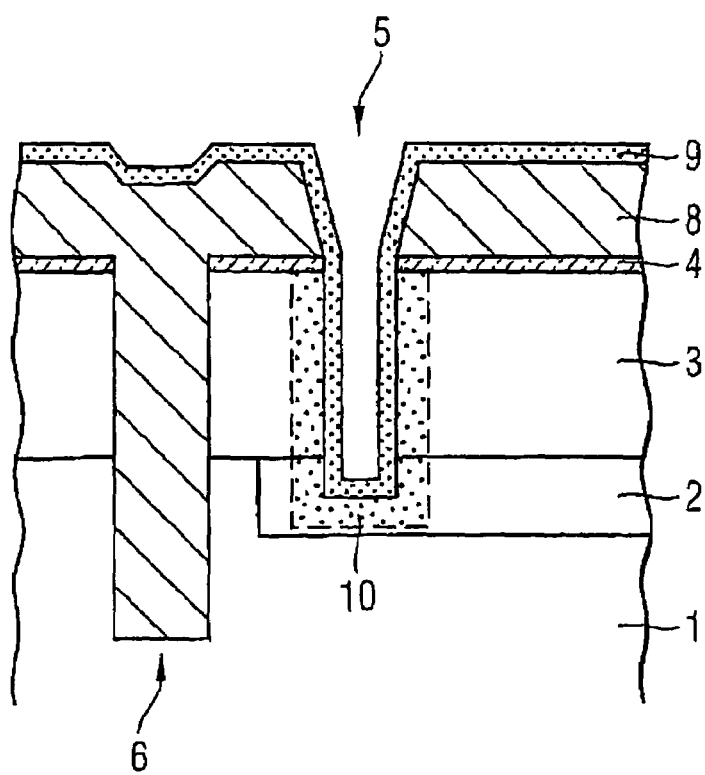
FIG. 5B illustrates a schematical cross-section of the second embodiment of the semiconductor structure of the invention at a second processing step according to the first embodiment of the method of the invention.

As illustrated in FIG. 5, a thick dielectric layer 8, for instance of silicon oxide, is deposited following the etching process such that contact hole 5 and isolation trench 6 are filled (FIG. 5A). It may be possible, that voids are formed in deposited dielectric material of layer 8 within trench 6. This may be caused by the deposition properties and the aspect ratio of isolation trench 6 (ratio of depth $d_G$ to width $b_G$). The effects of these voids in dielectric layer 8 have to be considered in the following processing.

Subsequently, a lithography process and an isotropic etching process are carried out to open contact hole 5. After removal of the photoresist mask, dopants of the second conductivity type are provided. This may, by way of example, be accomplished by conformally depositing a heavily-doped oxide layer 9 and driving in the dopants by thermal treatment. Preceding thermal treatment, an undoped auxiliary oxide (not shown) may be deposited on heavily-doped layer 9, wherein the auxiliary oxide prevents the outdiffusion of dopants into the gaseous phase during thermal treatment. The auxiliary oxide is removed simultaneously with heavily-doped oxide layer 9 in further processing. The auxiliary oxide described for this embodiment may be used in other embodiments of the method according to this invention described later as well. Dopants may be provided from a gaseous phase instead of a heavily-doped oxide layer as well.

A diffusion zone 10 of the second conductivity type surrounding contact hole 5 is formed by thermally driving in dopants into semiconductor layer 3 and buried layer 2 (FIG.

5B). A contact to buried layer 2 may be formed even if etched hole 5 does not reach buried layer 2. In this case, the distance between the bottom portion of etched hole 5 and the surface of buried layer 2 facing hole 5 has to be smaller than the width of diffusion zone 10 in order to realize a low resistance contact to buried layer 2.

Figure 5C:
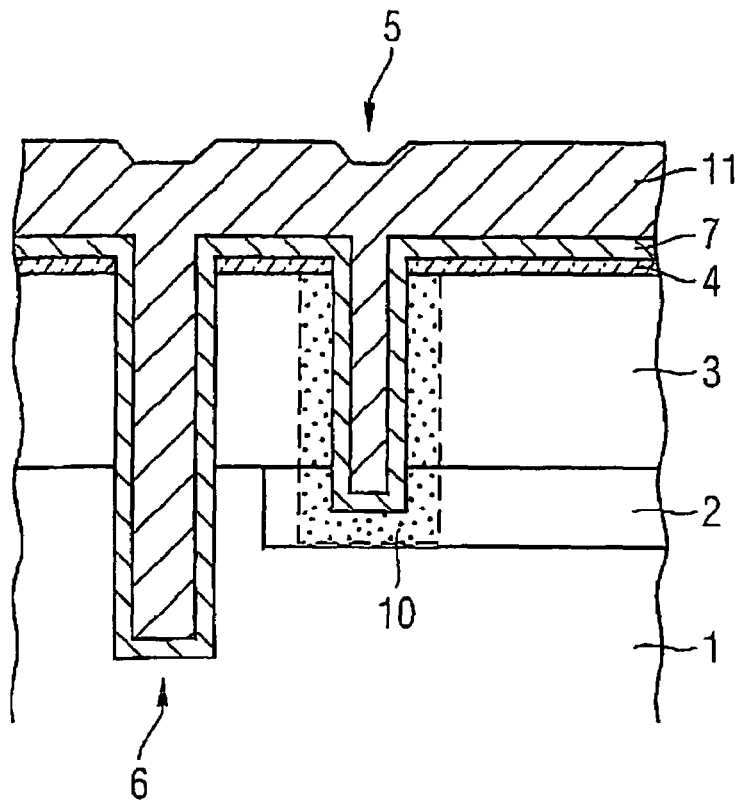
FIG. 5C illustrates a schematical cross-section of the second embodiment of the semiconductor structure of the invention at a third processing step according to the first embodiment of the method of the invention.

Following the formation of diffusion zone 10, heavily-doped oxide layer 9 and thick dielectric layer 8 are isotropicly etched and removed. Subsequently, a thin dielectric layer 7 of silicon oxide by way of example is conformally deposited such that dielectric layer 7 covers the surfaces of contact hole 5 and isolation trench 6. To be more specific, the side walls and the bottom portions of contact hole 5 and isolation trench 6 are covered by layer 7. However, dielectric layer 7 does not completely fill hole 5 and trench 6. Subsequently, hole 5 and trench 6 are filled with a polysilicon layer 11. Deposition properties of polysilicon are better than that of silicon oxide deposited by a TEOS method by way of example. Therefore, polysilicon filling 11 without voids is formed in trench 6 (FIG. 5C).

Figure 5D:
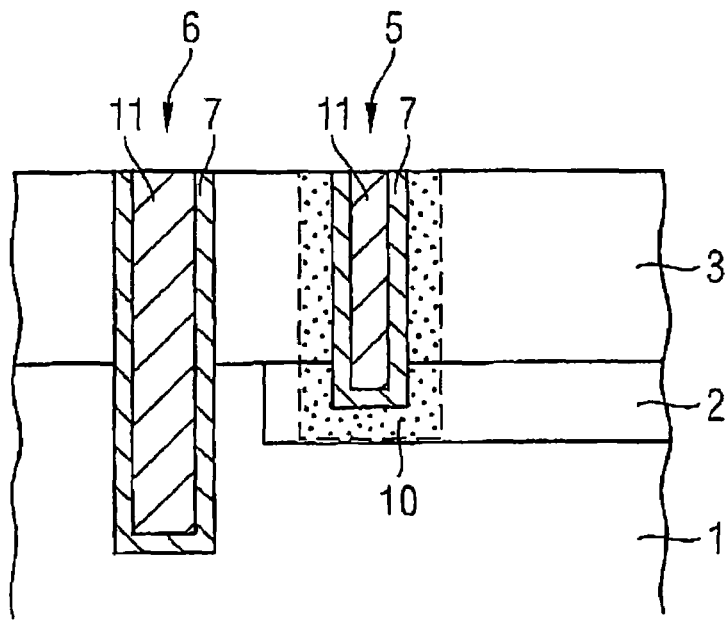
FIG. 5D illustrates a schematical cross-section of the second embodiment of the semiconductor structure of one embodiment of the invention.

Polysilicon layer 11, dielectric layer 7 and remaining hardmask 4 are anisotropicly etched back (recess etching) such that a semiconductor structure is formed as illustrated in FIG. 5D.

With this embodiment of the method according to the invention:

There is no photoresist within trench 6 at any time of processing, so it does not need to be removed. The removal of such a photoresist from within deep trenches with small width is very challenging and requires a great effort. Remaining residuals of photoresist can affect the further processing and parameters of deep trench isolation 62 manufactured by this process.

Only one polysilicon deposition step is necessary.

With one such processed semiconductor structure:

A polysilicon filling 11 is formed within isolation trench 6. Polysilicon filling 11 may be connected with a defined potential. Thus, floating of polysilicon within isolation trench 6 and therefore uncontrollable parasitic effects may be prevented.

Dielectric layer 7 within contact hole 5 makes possible to provide a trench capacitor using polysilicon layer 11 within contact hole 5 as a first electrode and diffusion zone 10 as a second electrode.

Figure 6A:
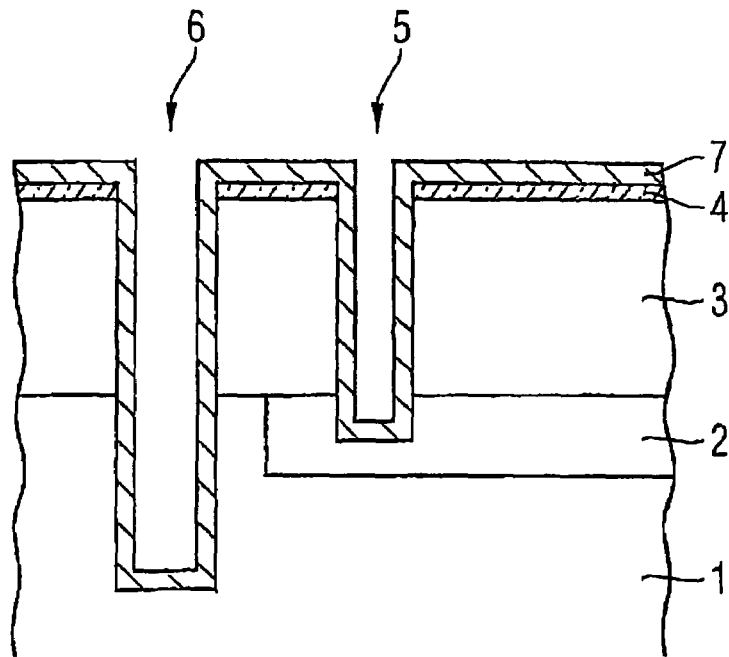
FIG. 6A illustrates a schematical cross-section of the second embodiment of the semiconductor structure of the invention at a first processing step according to a second embodiment of the method of the invention.

A further embodiment of the method according to one embodiment of the invention is illustrated in FIG. 6. After etching contact hole 5 and isolation trench 6, as illustrated in FIG. 4, a thin dielectric layer 7, of silicon oxide by way of example, is conformally deposited on the surface of the remaining hard mask 4 and on the surfaces of contact hole 5 and isolation trench 6 (FIG. 6A). As a result, dielectric layer 7 covers the side walls and the bottom portions of contact hole 5 and isolation trench 6.

Figure 6B:
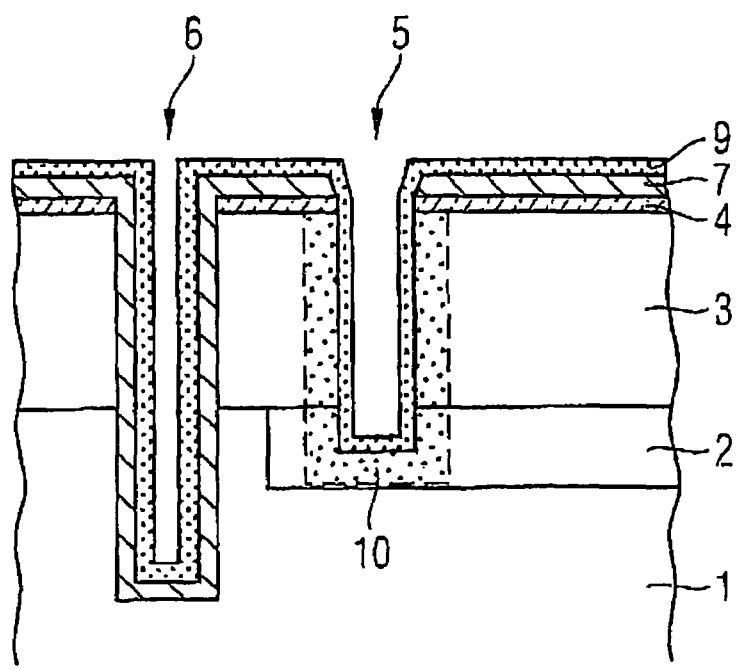
FIG. 6B illustrates a schematical cross-section of the second embodiment of the semiconductor structure of the invention at a second processing step according to the second embodiment of the method of the invention.

Subsequently, dielectric layer 7 is removed from the surfaces of contact hole 5 by a lithographic process and an isotropic etching process. After removal of the photoresist mask, dopants of the second conductivity type are provided by conformally depositing a heavily-doped oxide layer 9 by way of example. Dopants are driven in by thermal treatment. A diffusion zone 10 of the second conductivity type surrounding contact hole 5 is formed within monocrystalline layer 3 (FIG. 6B). Dopants may also be provided from a gas.

The thickness of dielectric layer 7 has to be selected such that dopants do not diffuse through the dielectric layer 7 within trench 6 during thermal treatment.

Subsequently, heavily-doped oxide layer 9 and thin dielectric layer 7 are removed by isotropic etching. Further processing of semiconductor structure is the same as described above (see FIGS. 5C and 5D). Thereby, a semiconductor structure as illustrated in FIG. 5D is formed.

With this embodiment of the method according to the invention, at the beginning only a thin dielectric layer 7 has to be deposited instead of a thick dielectric layer 8. Therefore no problems with voids within dielectric layer 8 arise.

Figure 7A:
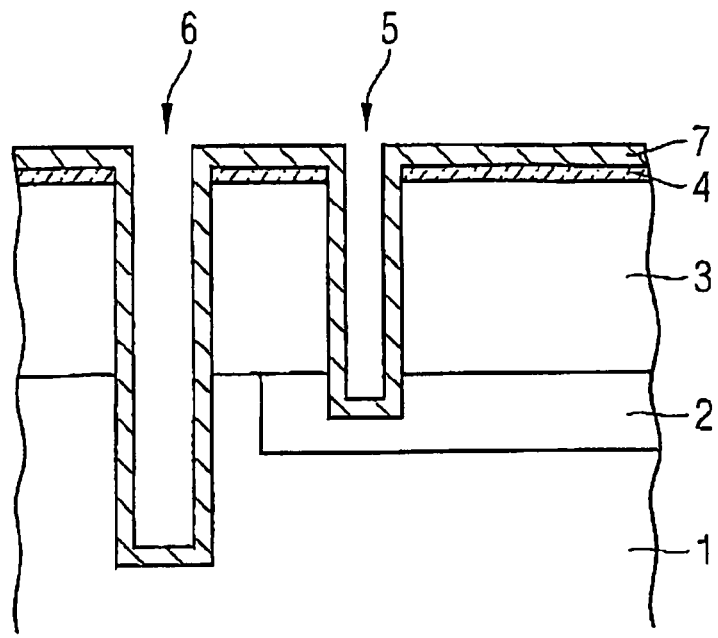
FIG. 7A illustrates a schematical cross-section of the first embodiment of the semiconductor structure of the invention at a first processing step according to a third embodiment of the method of the invention.

FIG. 7 illustrates a further embodiment of the method according to the invention. After etching hole 5 and trench 6, a thin dielectric layer 7 for instance of silicon oxide is conformally deposited. Dielectric layer 7 covers the surfaces of hole 5 and trench 6, that are the side walls and the bottom portions of hole 5 and trench 6 (FIG. 7A).

Figure 7B:
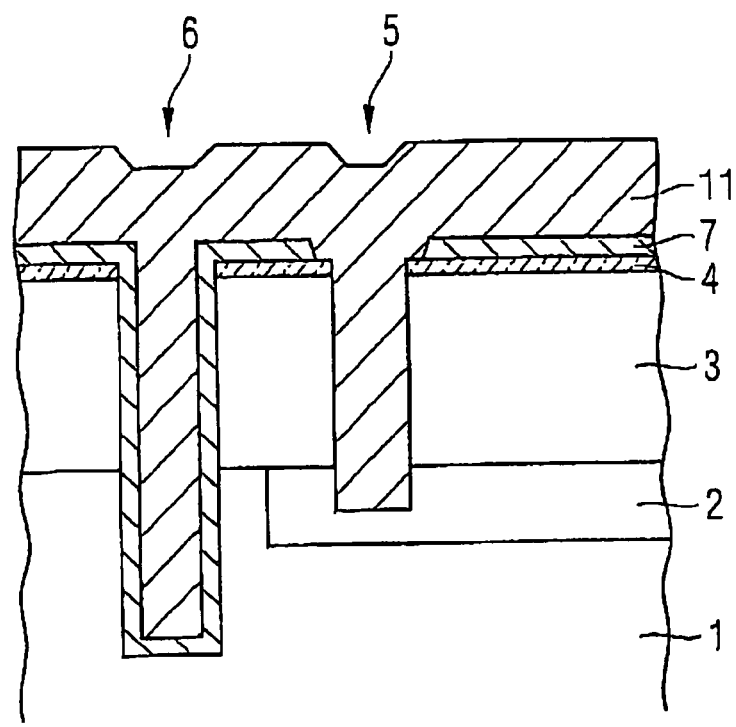
FIG. 7B illustrates a schematical cross-section of the first embodiment of the semiconductor structure of the invention at a second processing step according to the third embodiment of the method of the invention.

Dielectric layer 7 is removed from hole 5 by a lithography process and an isotropic etching process. After removal of the photoresist mask, a polysilicon layer 11 of the second conductivity type is deposited which fills hole 5 and trench 6 (FIG. 7B). Subsequently, polysilicon layer 11, dielectric layer 7 and hardmask 4 are removed by anisotropic recess etching, thereby obtaining semiconductor structure illustrated in FIG. 1.

With this embodiment of the method, there are a small number of necessary process steps. For example, only one deposition of a dielectric and one deposition of polysilicon is necessary.

With such a manufactured semiconductor structure, the polysilicon filling of trench 6 may be connected to a defined potential.

FIG. 8 illustrates a further embodiment of the method according to the invention. A thick dielectric layer 8 for instance of silicon oxide is deposited following the etching of hole 5 and trench 6. Dielectric layer 8 completely fills hole 5 and trench 6 (FIG. 8A). It is noted, that voids may be formed in the dielectric layer 8 within trench 6 as described above.

Figure 8A:
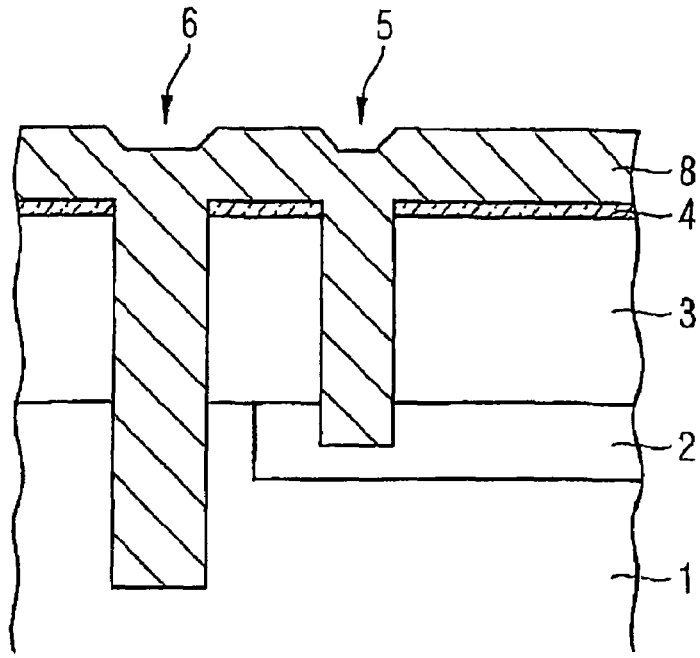
FIG. 8A illustrates a schematical cross-section of a third embodiment of the semiconductor structure of the invention at a first processing step according to a fourth embodiment of the method of the invention.
Figure 8B:
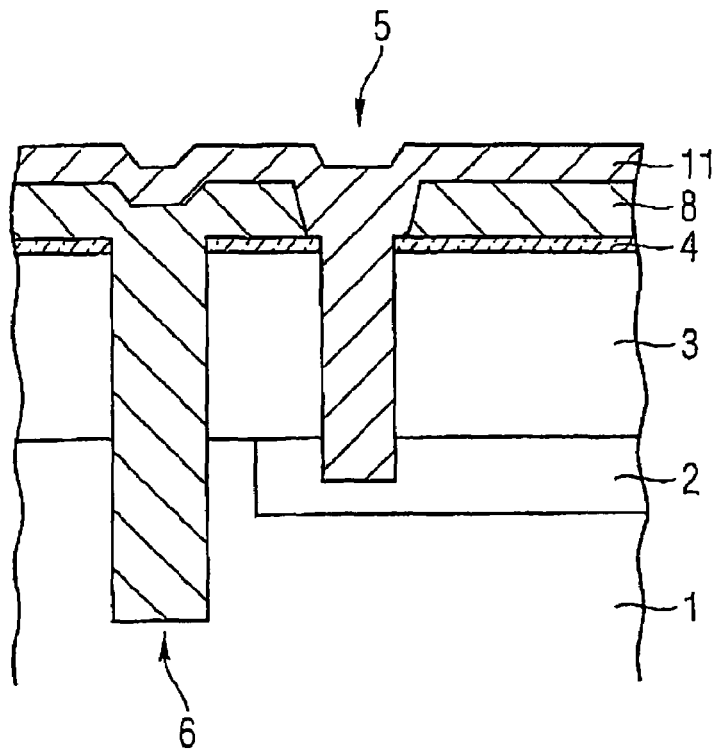
FIG. 8B illustrates a schematical cross-section of the third embodiment of the semiconductor structure of the invention at a second processing step according to the fourth embodiment of the method of the invention.

Subsequently, dielectric layer 8 is removed from within contact hole 5 by a lithography process and an isotropicly etching process. After removal of the photoresist, a polysilicon layer 11 of the second conductivity type is deposited which completely fills contact hole 5 (FIG. 8B).

Figure 8C:
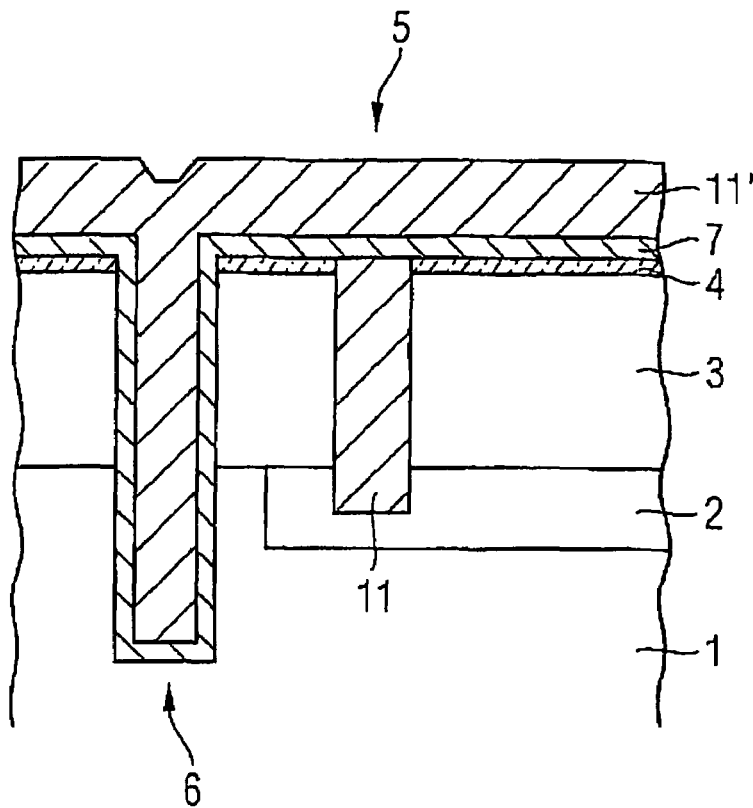
FIG. 8C illustrates a schematical cross-section of the third embodiment of the semiconductor structure of the invention at a third processing step according to the fourth embodiment of the method of the invention.

Subsequently, polysilicon layer 11 is etched anisotropicly and dielectric layer 8 is etched isotropicly. Thus, polysilicon layer 11 remains within hole 5 and dielectric layer 8 is removed from within trench 6. A thin dielectric layer 7 is conformally deposited on the surface of polysilicon layer 11 filling hole 5, on the surface of hardmask 4, and on the surface of trench 6, that is the side walls and the bottom portion of trench 6. A polysilicon layer 11' of any conductivity type is deposited, which fills trench 6 (FIG. 8C).

Figure 8D:
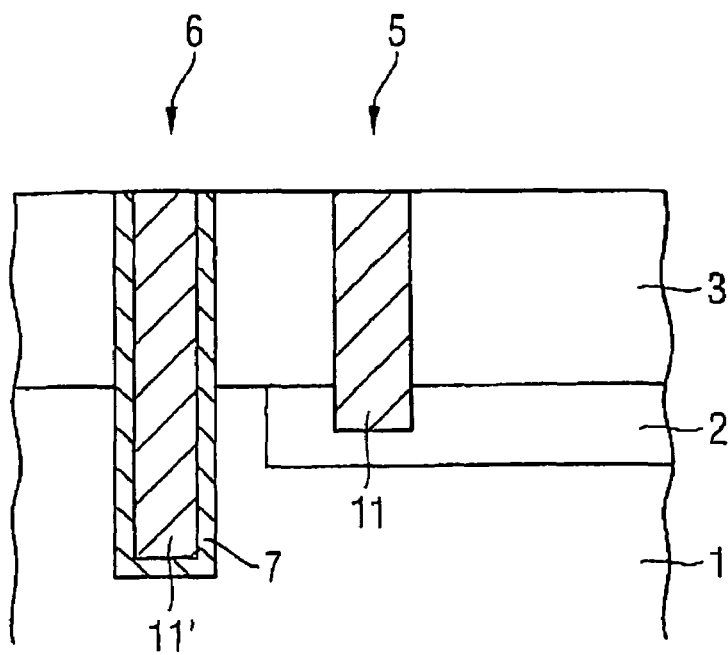
FIG. 8D illustrates a schematical cross-section of the third embodiment of the semiconductor structure of one embodiment of the invention.

Polysilicon layer 11', dielectric layer 7 and hardmask 4 are anisotropicly etched, thereby obtaining semiconductor structure as illustrated in FIG. 8D.

With this embodiment of the method according to the invention, compared with the embodiment of the method described with reference to FIG. 7, the photoresist is not deposited within trench 6 at any time during processing.

FIG. 9 illustrates a further embodiment of the method according to the invention. Following etching contact hole 5 and isolation trench 6, a thick dielectric layer 8, for instance of silicon oxide, is deposited within hole 5 and trench 6. As a result, hole 5 and trench 6 are completely filled with dielectric layer 8 (FIG. 9A). It is noted, that voids may be formed in layer 8 within trench 6 as described above.

Figure 9A:
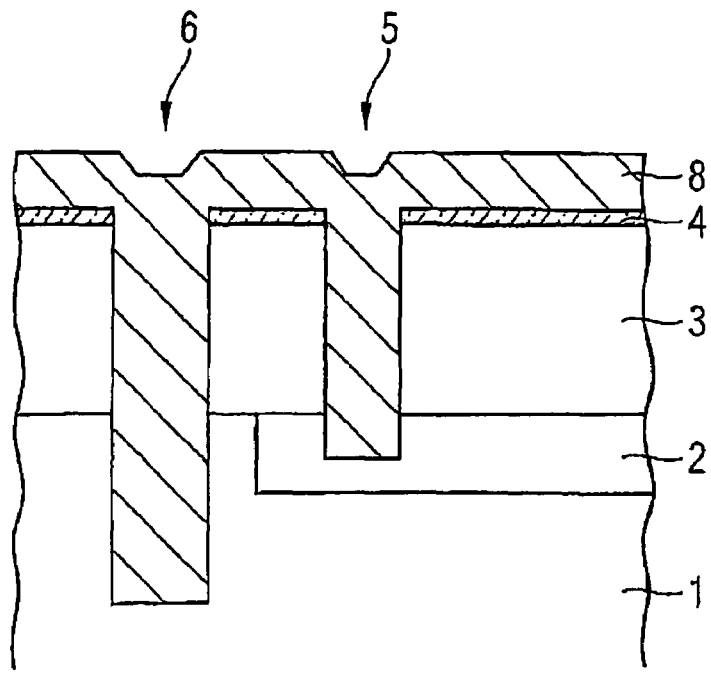
FIG. 9A illustrates a schematical cross-section of a fourth embodiment of the semiconductor structure of the invention at a first processing step according to a fifth embodiment of the method of the invention.
Figure 9B:
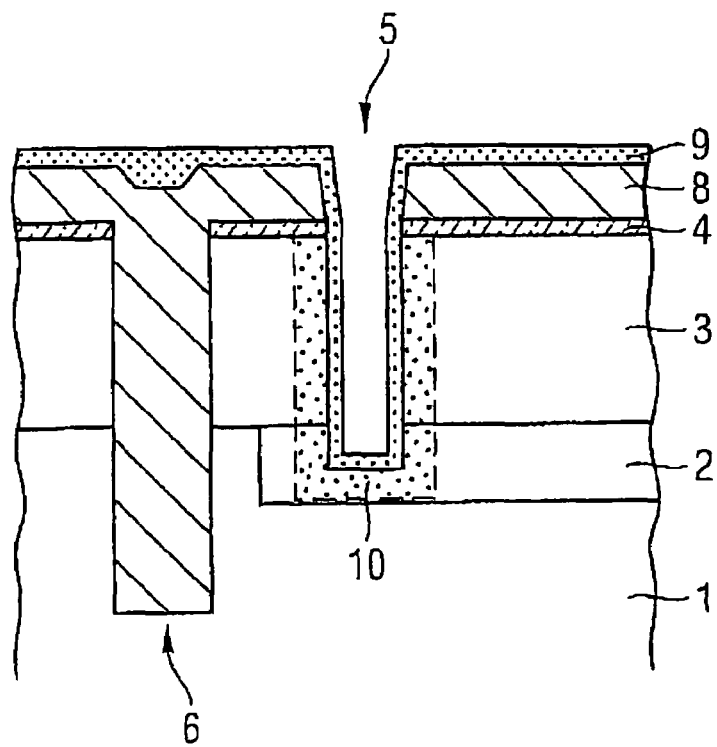
FIG. 9B illustrates a schematical cross-section of the fourth embodiment of the semiconductor structure of the invention at a second processing step according to the fifth embodiment of the method of the invention.

Thick dielectric layer 8 is removed from within contact hole 5 by a lithography process and an isotropic etching process. After removing the photoresist mask, dopants of the second conductivity type are provided by conformally depositing a heavily-doped oxide layer 9 on the surface of dielectric layer 8 and on the surface of contact hole 5. As a result, layer 9 covers the side walls and the bottom portion of contact hole 5. It is noted, that dopants may be provided also from the gaseous phase. A heavily-doped diffusion zone 10 of the second conductivity type surrounding contact hole 5 is formed within semiconductor layer 3 and buried layer 2 by thermally driving in dopants. The resulting structure is illustrated in FIG. 9B.

Figure 9C:
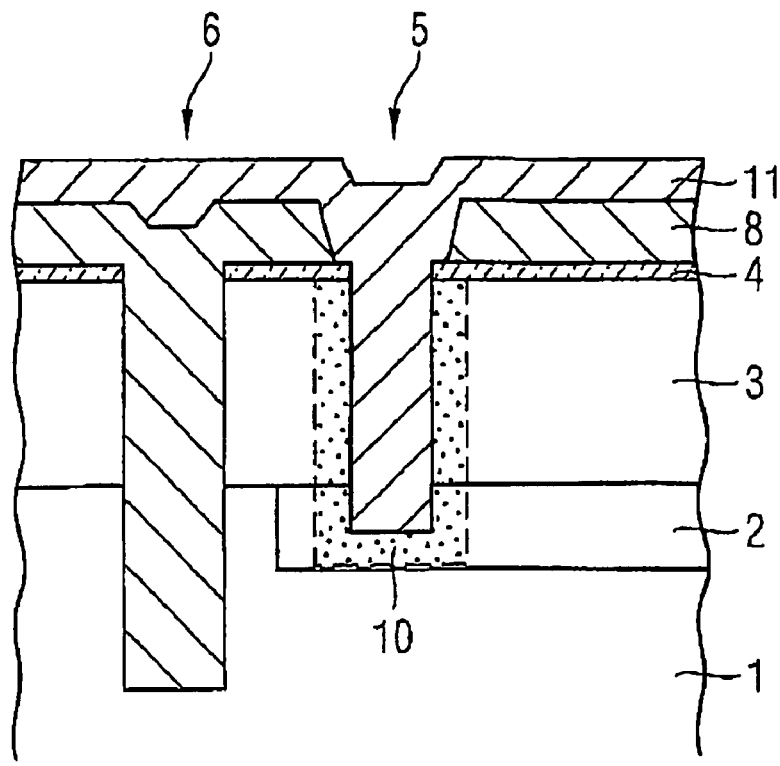
FIG. 9C illustrates a schematical cross-section of the fourth embodiment of the semiconductor structure of the invention at a third processing step according to the fifth embodiment of the method of the invention.
Figure 9D:
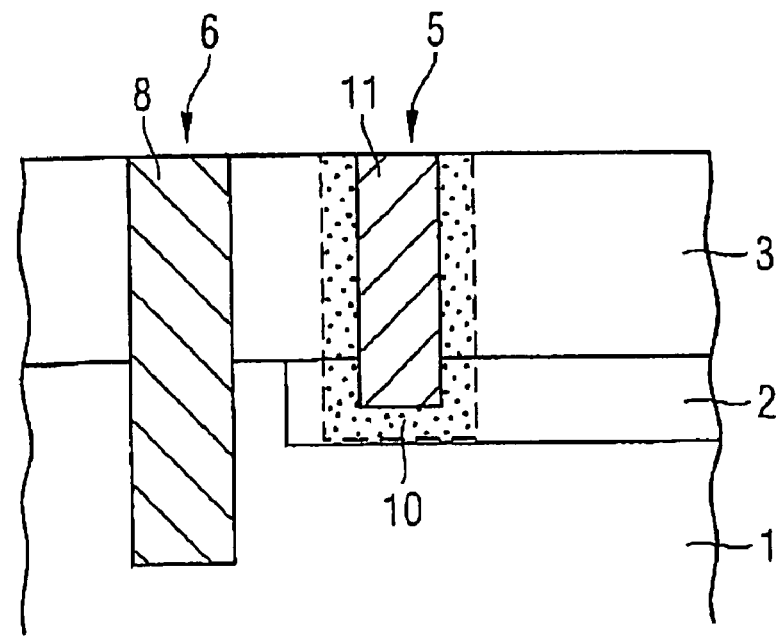
FIG. 9D illustrates a schematical cross-section of the fourth embodiment of the semiconductor structure of one embodiment of the invention.

Subsequently, oxide layer 9 is removed from the surface of the semiconductor structure and from contact hole 5, and a polysilicon layer 11 of the second conductivity type is deposited such that it completely fills contact hole 5 (FIG. 9C). Polysilicon layer 11, dielectric layer 8 and remaining hardmask 4 are anisotropicly etched back, thereby obtaining semiconductor structure illustrated in FIG. 9D.

With this embodiment of the invention, photoresist is avoided within trench 6 at any processing time and only one deposition of polysilicon is used.

With the resulting semiconductor structure, good contact of polysilicon layer 11 within contact hole 5 to buried layer 2 is caused by the diffusion zone 10 resulting in a small turn-on resistance $R_{on}$.

A further embodiment of the method according to the invention is described with respect to FIG. 10. After etching contact hole 5 and isolation trench 6, a thin dielectric layer 7, for instance of TEOS, is conformally deposited on the surface of hardmask 4 and the surfaces of hole 5 and trench 6. As a result, layer 7 covers the side walls and the bottom portions of hole 5 and trench 6. Further, a polysilicon layer 11 is deposited such that hole 5 and trench 6 are completely filled (FIG. 10A). Since deposition properties of polysilicon within deep trenches with a small width (that are trenches with a high aspect ratio) is better than that of silicon oxide deposited by a TEOS method for instance, no voids may arise in polysilicon layer 11 within filled trench 6.

Figure 10A:
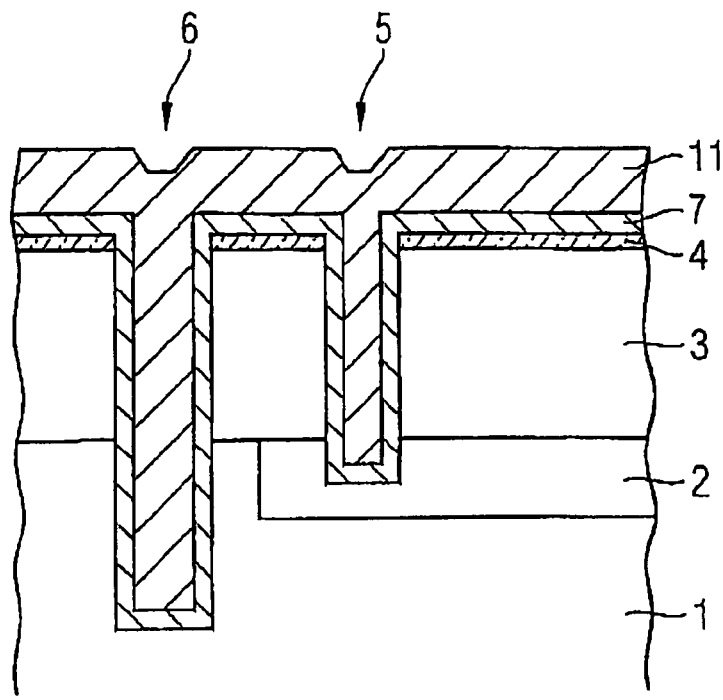
FIG. 10A illustrates a schematical cross-section of a fifth embodiment of the semiconductor structure of the invention at a first processing step according to a sixth embodiment of the method of the invention.
Figure 10B:
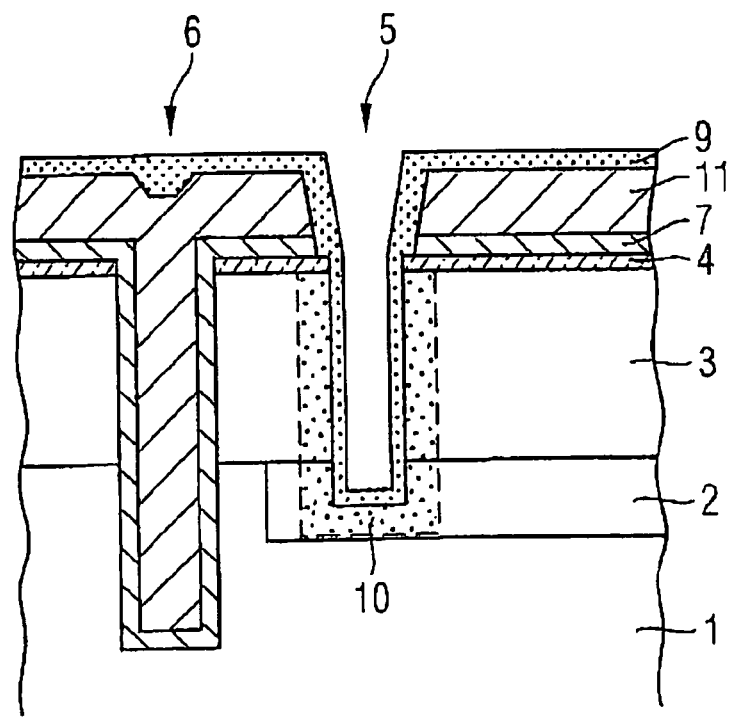
FIG. 10B illustrates a schematical cross-section of the fifth embodiment of the semiconductor structure of the invention at a second processing step according to the sixth embodiment of the method of the invention.

Polysilicon layer 11 and dielectric layer 7 are removed from contact hole 5 by a lithography process and a subsequent isotropic etching process. Subsequently, a diffusion zone 10 of the second conductivity type surrounding hole 5 is formed by thermally driving in dopants of the second conductivity type. Dopants may be provided from a conformally deposited heavily-doped oxide layer 9, as illustrated in FIG. 10B, or from the gaseous phase.

Figure 10C:
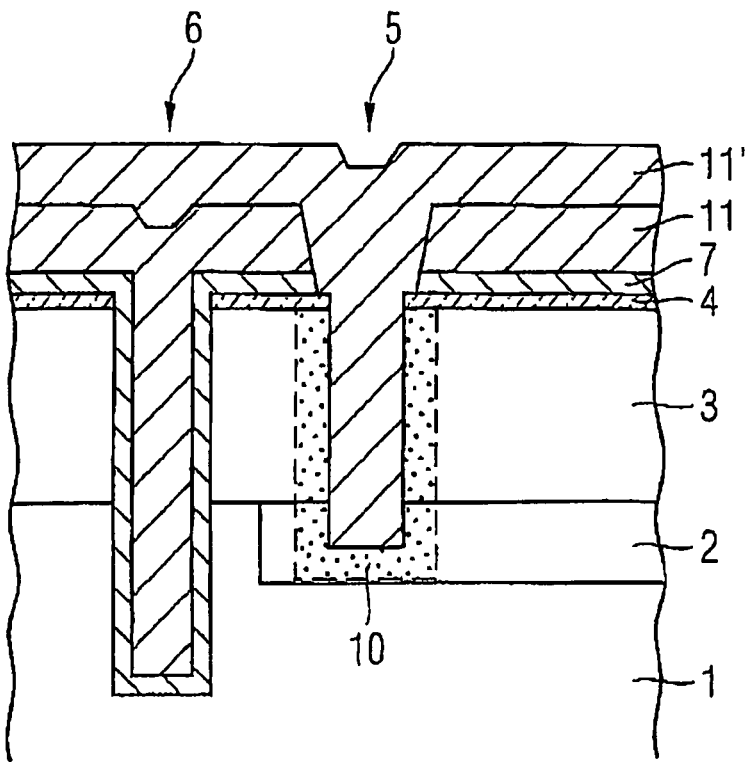
FIG. 10C illustrates a schematical cross-section of the fifth embodiment of the semiconductor structure of the invention at a third processing step according to the sixth embodiment of the method of the invention.
Figure 10D:
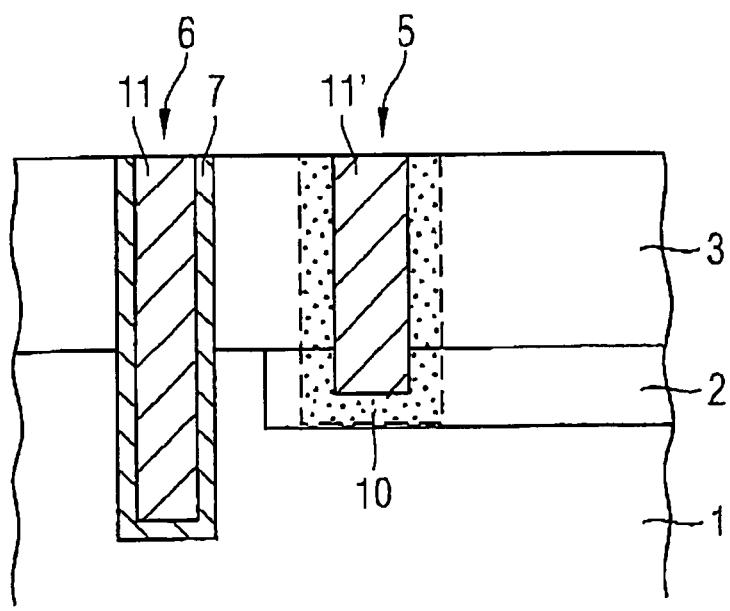
FIG. 10D illustrates a schematical cross-section of the fifth embodiment of the semiconductor structure of one embodiment of the invention.

A second polysilicon layer 11' of the second conductivity type is deposited following isotropic etching heavily-doped oxide layer 9. As a result, polysilicon 11' completely fills hole 5 (FIG. 10C). Polysilicon layer 11', polysilicon layer 11, dielectric layer 7 and remaining hardmask 4 are anisotropicly etched back, thereby obtaining semiconductor structure as illustrated in FIG. 10D.

With this embodiment of the method according to the invention, compared with the embodiment described with respect to FIG. 9, the deposition of conformal dielectric layer 7 and polysilicon layer 11 within trench 6 thereby avoiding voids in the filling of trench 6.

With the produced semiconductor structure, the especially good contact of polysilicon layer 11' within contact hole 5 to buried layer 2 is caused by diffusion zone 10. Also polysilicon layer 11 within isolation trench 6 may be connected with a defined potential.

In the embodiments of the method according to the invention described with respect to FIGS. 5 to 10, a lithography process is used in order to open contact hole 5 for forming diffusion zone 10 or filling contact hole 5 with polysilicon. A further embodiment of the method according to the invention is described with respect to FIG. 11, wherein this lithography process is not employed.

Figure 11A:
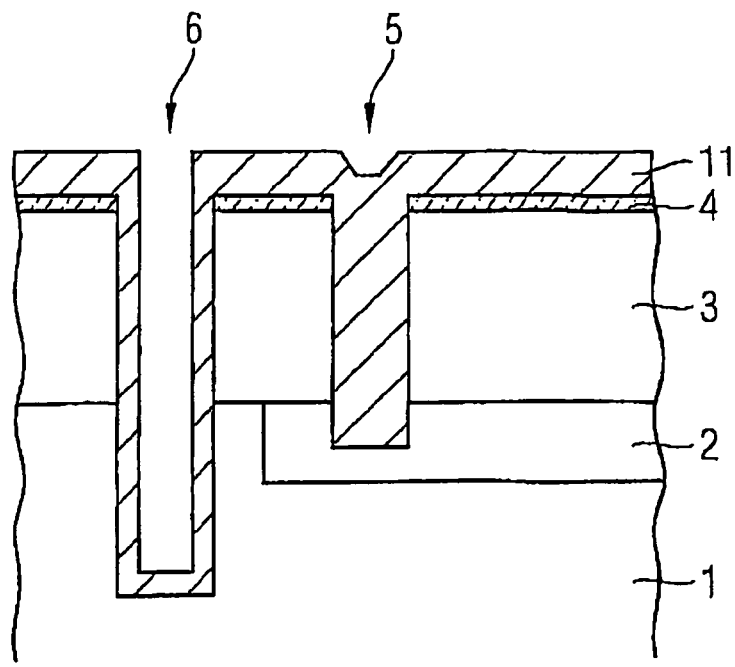
FIG. 11A illustrates a schematical cross-section of the third embodiment of the semiconductor structure of the invention at a first processing step according to a seventh embodiment of the method of the invention.

After etching contact hole 5 and trench 6, a polysilicon layer 11 of the second conductivity type is deposited such that hole 5 is completely filled, but layer 11 only covers the surface of trench 6, that is the side walls and the bottom portion of trench 6, as illustrated in FIG. 11A. The difference in deposition behaviour of layer 11 is caused by the larger width of trench 6 compared with the width of hole 5.

Figure 11B:
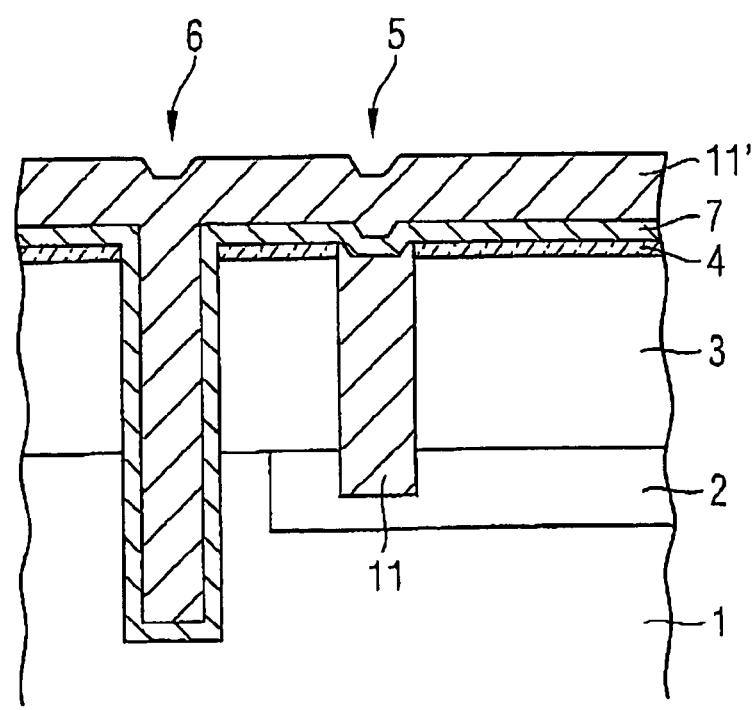
FIG. 11B illustrates a schematical cross-section of the third embodiment of the semiconductor structure of the invention at a second processing step according to the seventh embodiment of the method of the invention.

Polysilicon layer 11 is completely removed from the surface of trench 6 by a subsequent isotropic etching process, which is performed such that layer 11 remains within hole 5. A thin dielectric layer 7, for instance of silicon oxide, is conformally deposited on the surface of hardmask 4, the surface of polysilicon layer 11 within hole 5, and the surface of trench 6, that is the side walls and the bottom portion of trench 6 are covered with polysilicon layer 11. A second polysilicon layer 11' is deposited such that trench 6 is completely filled (FIG. 11B). Polysilicon layer 11', dielectric layer 7 and remaining hardmask 4 are anisotropicly etched back, thereby obtaining semiconductor structure as illustrated in FIG. 11C.

With this embodiment of the method according to the invention, one lithography step is saved and a minimal number of processing steps are used.

With the resulting semiconductor structure, the presence of polysilicon layer 1' within trench 6 may be connected with a defined potential.

Figure 12:
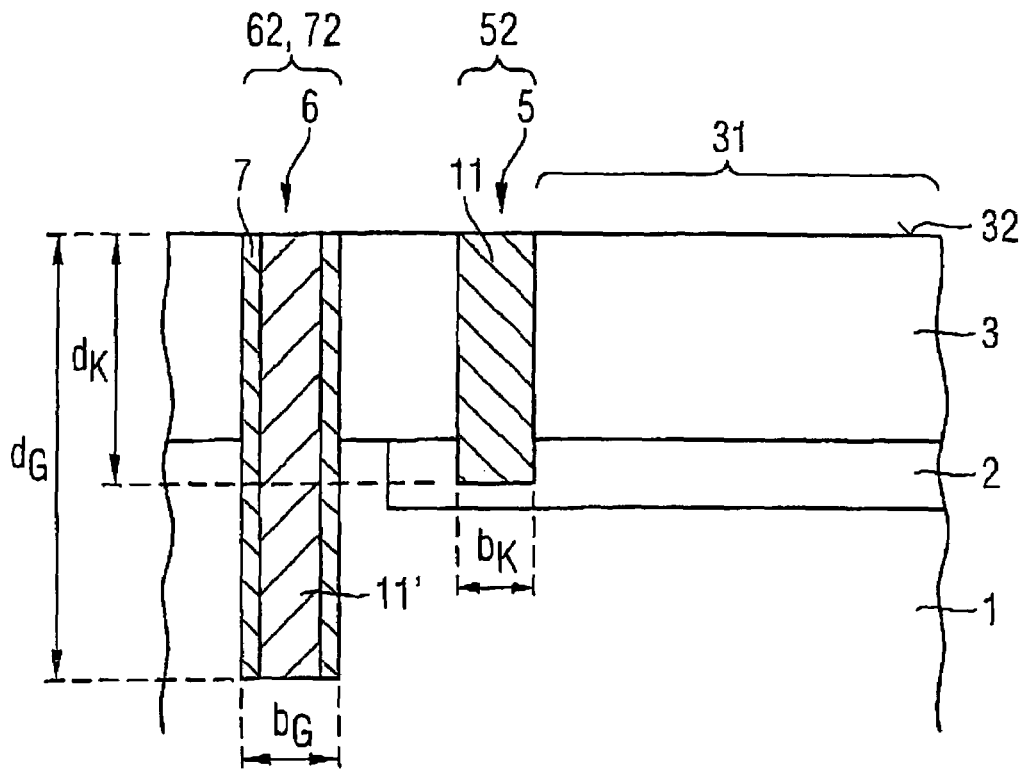
FIG. 12 illustrates a schematical cross-section of a sixth embodiment of the semiconductor structure of one embodiment of the invention.

FIG. 12 is a schematical cross-section of another embodiment of the semiconductor structure according to the invention. It illustrates a deep trench isolation 62, a deep trench substrate contact 72, and a buried layer contact 52. A heavily-doped buried layer 2 of a second conductivity type is formed in a semiconductor substrate 1 of a first conductivity type. A second semiconductor layer 3 of a third conductivity type is formed on the surface of semiconductor substrate 1 and buried layer 2 by epitaxy. The portion of monocrystalline layer 3 on top of buried layer 2 forms an active area 31, in which the elements using the buried layer are formed. These elements or devices may be formed before or after carrying out the method according to this invention.

The semiconductor structure includes deep trench isolation 62 which laterally insulates different circuit elements from each other. The isolation 62 is formed in an isolation trench 6. Isolation trench 6 has a width $b_G$ and a depth $d_G$, the depth being measured from a surface 32 of monocrystalline semiconductor layer 3. The side walls of trench 6 are covered by a dielectric (insulating) layer 7. Trench 6 is filled with a polysilicon 11' of the first conductivity type, thereby forming the contact 72 to semiconductor substrate 1.

The contact to buried layer 2 within a circuit element is formed by contact 52. Contact 52 is formed in a contact structure 5. Contact structure 5 has a width $b_K$ and a depth $d_K$, the depth $d_K$ being measured from surface 32. In the embodiment illustrated in FIG. 12, contact structure 5 is filled with a polysilicon 11 of the second conductivity type.

Contact structure 5 may have any shape, like for instance the shape of a hole or of a trench.

With the semiconductor structure illustrated in FIG. 12, there is small surface area required for contacting substrate 1 and buried layer 2 and for laterally insulating different portions of the semiconductor structure. Also there is low resistance of substrate contact 72 and buried layer contact 52.

The buried layer may be formed on the whole surface of the semiconductor substrate or only in some lateral portions of the semiconductor substrate by using a mask.

For example, in one case the trench for the insulation reaches into the semiconductor substrate. For example in another case, the contact structure for contacting the buried layer reaches at least to the surface of the buried layer.

Figure 13:
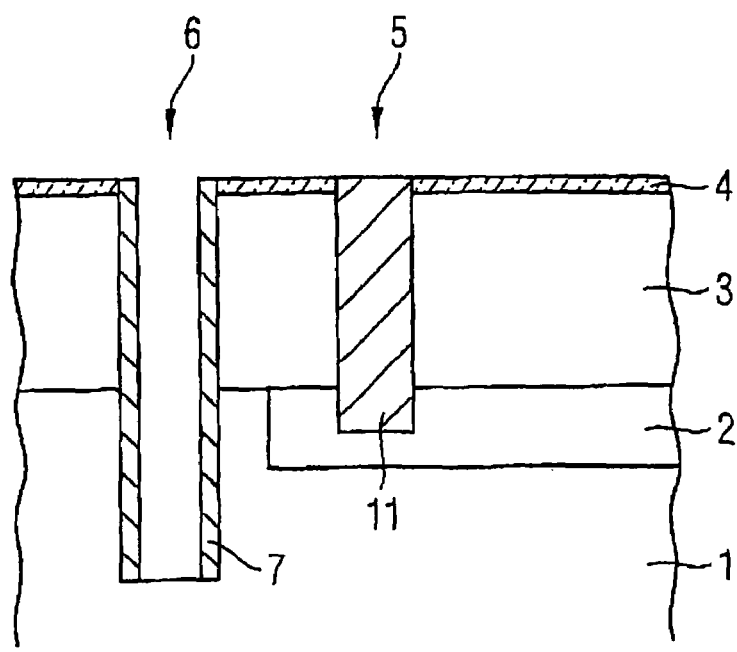
FIG. 13 illustrates a schematical cross-section of the sixth embodiment of the semiconductor structure at a first processing step according to an eighth embodiment of the method of the invention.

FIG. 13 illustrates an embodiment of the method to manufacture the semiconductor structure illustrated in FIG. 12. Trench 6 and contact structure 5 are formed in the surface of the semiconductor structure. This may be accomplished by carrying out the process steps described with respect to FIG. 4. Nevertheless, other methods of forming trench 6 and contact structure 5 are possible. Further, contact structure 5 is completely filled with a polysilicon layer 11 of the second conductivity type. A thin dielectric layer 7 is conformaly deposited. As a result, the surface of polysilicon layer 11 filling contact structure 5, the surface of hardmask 4, and the surface of trench 6, that is the side walls and the bottom portion of trench 6, are covered by layer 7. Dielectric layer 7 is removed from the bottom portion of trench 6 by an anisotropic etching process. The resulting structure is illustrated in FIG. 13.

Subsequently, a polysilicon layer 11' of the first conductivity type is deposited which completely fills trench 6. Polysilicon layer 11', dielectric layer 7 and hardmask 4 are anisotropicly etched, thereby obtaining semiconductor structure as illustrated in FIG. 12.

Figure 14:
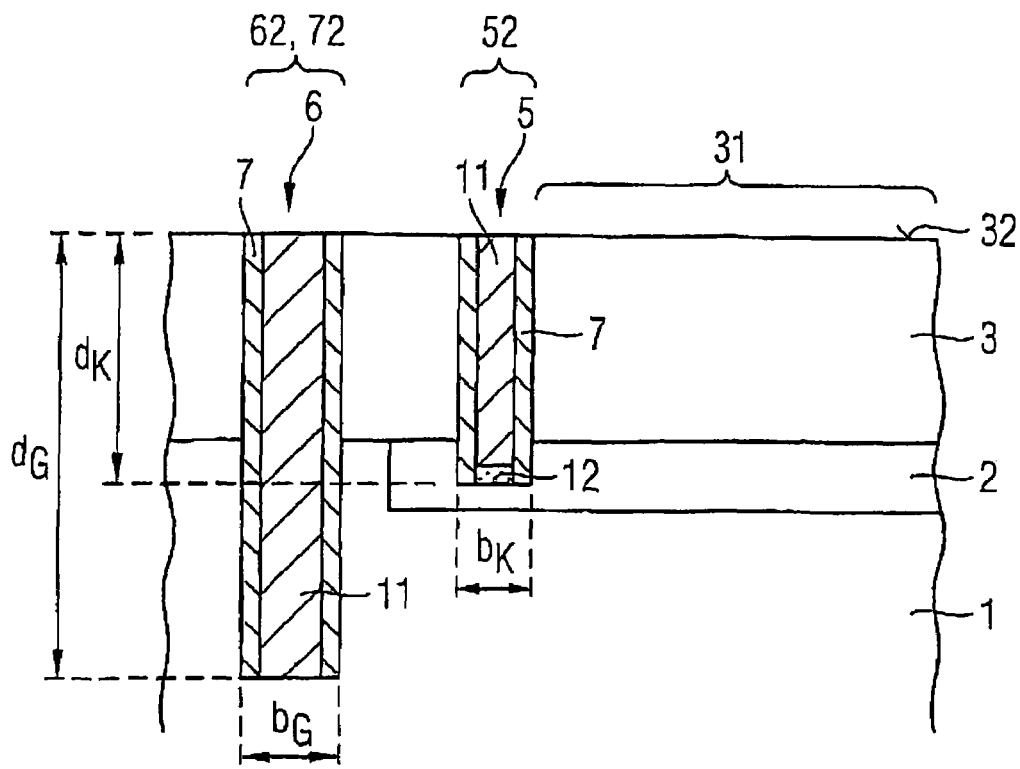
FIG. 14 illustrates a schematical cross-section of a seventh embodiment of the semiconductor structure of one embodiment of the invention.

FIG. 14 is a schematical cross-section of another embodiment of the semiconductor structure according to the invention. FIG. 14 illustrates a deep trench isolation 62, a deep trench substrate contact 72, and a buried layer contact 52. A heavily-doped buried layer 2 is formed in a semiconductor substrate 1. A second semiconductor layer 3 is formed on the surface of semiconductor substrate 1 and buried layer 2 by epitaxy. The portion of monocrystalline layer 3 on top of buried layer 2 forms an active area 31, in which the elements using the buried layer are formed.

The semiconductor structure includes deep trench isolation 62 which insulates different circuit elements from each other. The isolation 62 is formed in an isolation trench 6. Isolation trench 6 has a width $b_G$ and a depth $d_G$, the depth being measured from a surface 32 of monocrystalline semiconductor layer 3. The side walls of trench 6 are covered by a dielectric (insulating) layer 7. Trench 6 is completely filled with a polysilicon 11 of the first conductivity type, thereby forming the contact 72 to semiconductor substrate 1.

The contact to buried layer 2 within a circuit element is formed by contact 52. The contact 52 is formed in a contact structure 5. Contact structure 5 has a width $b_K$ and a depth $d_K$, the depth $d_K$ being measured from surface 32. Dielectric layer 7 covers the side walls of contact structure 5. At the bottom portion of contact structure 5 a metal-silicide 12 is formed to provide contact to buried layer 2. Contact structure 5 is filled with polysilicon 11. Metal-silicide 12 may include TiSi, WSi, CoSi, TaSi, HfSi, HfSiOx and others. Exemplary, compounds of silicon with other transition metals or electrically conductive nitrides or carbides, like for instance TiN, WN, TaN, TaSiN, TiSiN, WC and TiC, or graphite may be used as or instead of metal-silicide 12.

In the case, that the semiconductor material of substrate 1, buried layer 2 or semiconductor layer 3 is not silicon, metal-silicide 12 may be a compound of the used semiconductor material and a metal or may be an electrically conductive nitride or carbide.

Contact structure 5 may have any shape, like for instance the shape of a hole or of a trench.

Figure 15A:
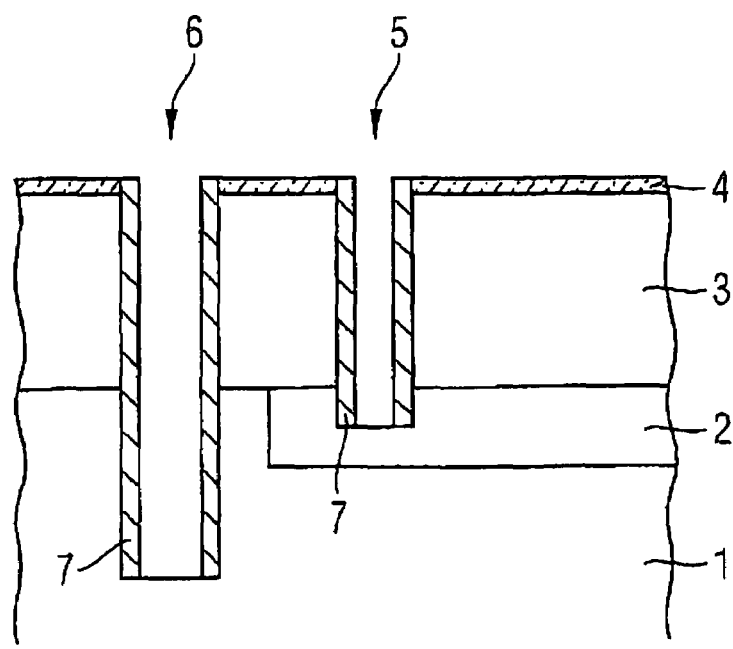
FIG. 15A illustrates a schematical cross-section of the seventh embodiment of the semiconductor structure at a first processing step according to a ninth embodiment of the method of the invention.

A method for manufacturing the semiconductor structure illustrated in FIG. 14 is described with respect to FIG. 15. Contact structure 5 and isolation trench 6 are formed in the surface of the semiconductor structure, as by way of example illustrated in FIG. 4. A thin dielectric layer 7, for instance of TEOS, is conformally deposited. As a result, layer 7 covers the surface of hardmask 4 and the surfaces of contact structure 5 and trench 6, that are the side walls and the bottom portions of contact structure 5 and trench 6. Layer 7 is removed from the surface of hardmask 4 and from the bottom portions of trench 6 and contact structure 5 by an anisotropic etching process. The resulting structure is illustrated in FIG. 15A.

Figure 15B:
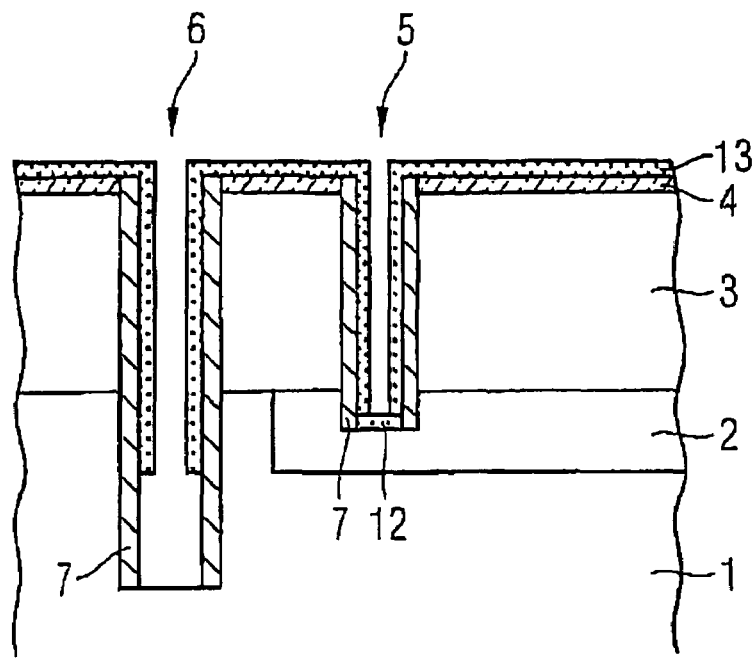
FIG. 15B illustrates a schematical cross-section of the seventh embodiment of the semiconductor structure at a second processing step according to the ninth embodiment of the method of the invention.

Subsequently, a metal layer 13 is deposited at the surface of hardmask 4 and the surfaces of contact structure 5 and trench 6. Metal layer 13 may include Ti, W, Co, Ta, Hf, graphite or others or nitrides or carbides of these metals. Since deposition of metal layers within deep trenches with high aspect ratios is very difficult, metal layer 13 may deposited only partially at the side walls of trench 6. As a result, only an upper portion of the side walls of trench 6 are covered by metal layer 13, leaving the bottom portion of trench 6 uncovered, as illustrated in FIG. 15B. Metal layer 13 is deposited at the side walls and the bottom portion of contact hole 5. A metal-silicide 12 is formed at those portions, on which metal layer 13 is deposited so as to be in contact with a semiconductor material, as for instance buried layer 2 at the bottom portion of contact structure 5. The resulting structure is illustrated in FIG. 15B.

Figure 15C:
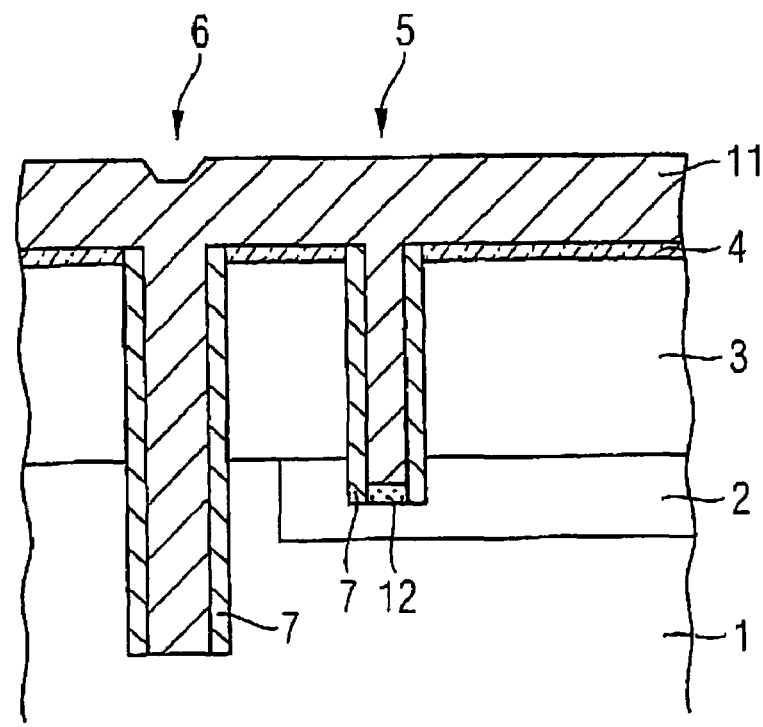
FIG. 15C illustrates a schematical cross-section of the seventh embodiment of the semiconductor structure at a third processing step according to the ninth embodiment of the method of the invention.

Subsequently, metal layer 13 is removed, thereby leaving metal-silicide 12 at the bottom portion of contact structure 5. A polysilicon layer 11 of the first conductivity type is deposited on the surface of hardmask 4 and the surfaces of contact structure 5 and trench 6, thereby filling contact structure 5 and trench 6 (FIG. 15C). Polysilicon layer 11 and remaining hardmask 4 are anisotropicly etched back, thereby obtaining semiconductor structure as illustrated in FIG. 14.

For small aspect ratios of trench 6 (smaller than 6), metal layer 13 may cover the bottom portion of trench 6. Nevertheless, it is possible to deposit metal layer 13 also at the bottom of deep trenches with high aspect ratios by CVD methods. In this case, metal-silicide 12 is formed also at the bottom portion of trench 6. In this case, conductivity type of polysilicon 11 may be selected arbitrarily.

With this method described with respect to FIG. 15, there are a small number of process steps and the possibility of contacting semiconductor layers of different conductivity type with only one polysilicon layer. Thus, process steps and costs may be saved while obtaining a semiconductor structure having low resistance contacts to substrate 1 and buried layer 2 and taking up only small surface area.

The substrate contact 72 and buried layer contact 52 comprising metal-silicide 12 may be formed after completion of Front End Of Line (FEOL) processes. This may be advantageous in some embodiments, since metal-silicide 12 may not withstand longer high-temperature steps being part of FEOL processes, like for instance high-temperature anneals.

Figure 16:
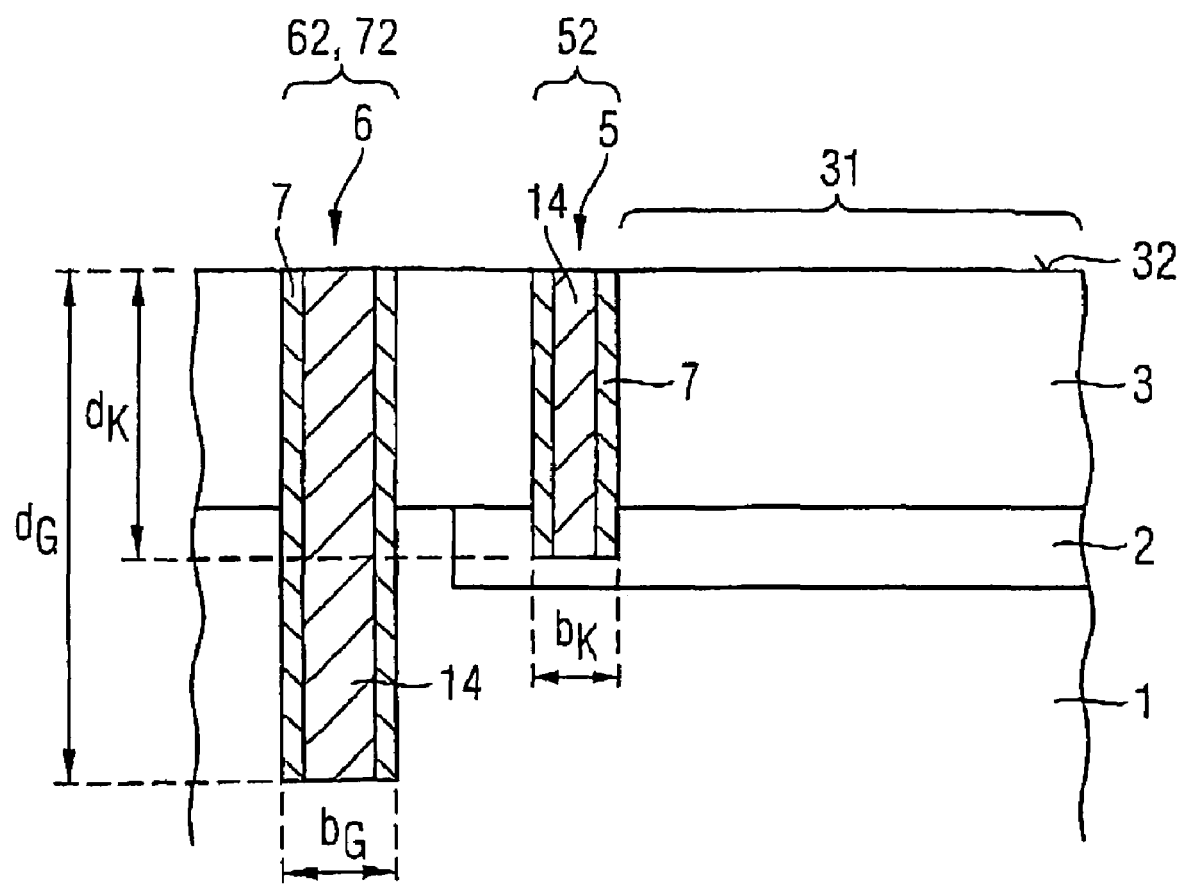
FIG. 16 illustrates a schematical cross-section of an eighth embodiment of the semiconductor structure of the invention.

FIG. 16 is a schematical cross-section of another embodiment of the semiconductor structure according to the invention. It illustrates a deep trench isolation 62, a deep trench substrate contact 72, and a buried layer contact 52. A heavily-doped buried layer 2 is formed in a semiconductor substrate 1. A second semiconductor layer 3 is formed on the surface of semiconductor substrate 1 and buried layer 2 by epitaxy. The portion of monocrystalline layer 3 on top of buried layer 2 forms an active area 31, in which the elements using the buried layer are formed.

The semiconductor structure includes deep trench isolation 62 which laterally insulates different circuit elements from each other. The isolation 62 is formed in an isolation trench 6. Isolation trench 6 has a width $b_G$ and a depth $d_G$, the depth being measured from a surface 32 of monocrystalline semiconductor layer 3. The side walls of trench 6 are covered by a dielectric (insulating) layer 7. Trench 6 is completely filled with a conductive material 14, thereby forming the contact 72 to semiconductor substrate 1.

The contact to buried layer 2 within a circuit element is formed by contact 52. Contact 52 is formed in a contact structure 5. Contact structure 5 has a width $b_K$ and a depth $d_K$, the depth $d_K$ being measured from surface 32. Dielectric layer 7 covers the side walls of contact structure 5, which is completely filled with conductive material 14.

Conductive material 14 may include Ti, W, Co, Al, Cu, graphite, conductive nitrides or carbides, like for instance TiN, WN, TaN, TaSiN, TiSiN, WC, TiC, and others. It is also possible to combine layers of different conductive materials 14 in order to completely fill contact structure 5 or trench 6.

Contact structure 5 may have any shape, like for instance the shape of a hole or of a trench.

A method for manufacturing the semiconductor structure illustrated in FIG. 16 is now described. Contact structure 5 and isolation trench 6 are formed in the surface of the semiconductor structure, as by way of example illustrated in FIG. 4. A thin dielectric layer 7, for instance of TEOS, is conformally deposited on the surface of hardmask 4 and the surfaces of contact structure 5 and trench 6. Layer 7 covers the side walls and the bottom portions of contact structure 5 and trench 6. Layer 7 is removed from the surface of hardmask 4 and from the bottom portions of trench 6 and contact structure 5 by an anisotropic etching process. The resulting structure is illustrated in FIG. 15A.

Subsequently, a conductive material 14 is deposited. Conductive material 14 covers the surface of hardmask 4 and completely fills contact structure 5 and trench 6. In the case, that the aspect ratio of trench 6 is high (higher than 6), conductive material 14 may be deposited by CVD methods. Conductive material 14 and remaining hardmask 4 are anisotropicly etched back, thereby obtaining semiconductor structure as illustrated in FIG. 16.

With the above described method, there are a small number of process steps and the possibility of contacting semiconductor layers of different conductivity type with only one conductive material layer. Thus, process steps and costs may be saved while obtaining a semiconductor structure having low resistance contacts to substrate 1 and buried layer 2 and taking up only small surface area.

Methods of providing a substrate contact and a buried layer contact as described above may be carried out for semiconductor structures include an isolation trench and a contact hole. Exemplary, the width of the contact hole is smaller than the width of the isolation trench. Further exemplary, the depth of the contact hole is smaller than the depth of the isolation trench.

Nevertheless, the methods of providing a substrate contact and a buried layer contact may be carried out for semiconductor structures comprising an isolation trench and a contact structure with other shapes and/or dimensions as well. Thus, a not-limited number of contacts to different semiconductor layers of different conductivity types and/or with different depths measured from the surface of the semiconductor structure may be provided with only one electrically conductive material.

Several possibilities to combine processing steps of above described embodiments of the methods according to the invention are given, as clearly understood by a person skilled in the art. Thus, a method of manufacturing a semiconductor structure including suitable processing steps may be provided in accordance to desired (specified) properties of the semiconductor structure and according to other requirements of processing. Thus, optimal variations of the method of manufacturing the semiconductor structure and of the semiconductor structure itself may be selected.

Some deposition processes, as for instance the deposition of dielectric layers and polysilicon, may be carried out simultaneously during processing of insulation 62 and buried layer contact 52.

The embodiments of the invention described in the foregoing are examples are given by way of illustration and the invention is in no ways limited thereto. Any modification, variation and equivalent arrangement should be considered as being included within the scope of the invention.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A method of manufacturing a semiconductor structure comprising:
   providing a semiconductor layer stack comprising a semiconductor substrate of a first conductivity type, a heavily-doped buried layer of a second conductivity type and a monocrystalline semiconductor layer of a third conductivity type formed on top of the semiconductor substrate and the buried layer, the monocrystalline semiconductor layer having an upper surface forming a surface of the semiconductor structure;
   forming a contact hole in the surface of the semiconductor structure so as to contact the buried layer, the contact hole having a first width and a first depth, the depth being measured from the surface of the semiconductor structure;
   forming an isolation trench in the surface of the semiconductor structure so as to laterally insulate different portions of the semiconductor structure, the isolation trench having a second width and a second depth, the depth being measured from the surface of the semiconductor structure; and
   selecting a ratio of the first to the second width in accordance to the desired ratio of the first to the second depth;
   wherein the isolation trench and the contact hole are formed simultaneously by one etching process.

2. The method of claim 1 wherein the ratio of the first depth to the second depth is smaller than 0.8.

3. The method of claim 1 further comprising depositing polycrystalline semiconductor material of the second conductivity type within the contact hole.

4. A method of manufacturing a semiconductor structure comprising:
   providing a semiconductor layer stack comprising a semiconductor substrate of a first conductivity type, a heavily-doped buried layer of a second conductivity type and a monocrystalline semiconductor layer of a third conductivity type formed on top of the semiconductor substrate and the buried layer, the monocrystalline semiconductor layer having an upper surface forming a surface of the semiconductor structure;
   forming a contact hole in the surface of the semiconductor structure so as to contact the buried layer, the contact hole having a first width and a first depth, the depth being measured from the surface of the semiconductor structure;

forming an isolation trench in the surface of the semiconductor structure so as to laterally insulate different portions of the semiconductor structure, the isolation trench having a second width and a second depth, the depth being measured from the surface of the semiconductor structure;

providing dopants of the second conductivity type from a gas or through depositing of a heavily-doped oxide layer within the contact hole;

forming a diffusion zone of the second conductivity type within the monocrystalline semiconductor layer and the buried layer by driving in the dopants through thermal treatment, wherein the diffusion zone surrounds the contact hole.

5. The method of claim 4 further comprising:

depositing a dielectric layer on the side walls and the bottom portion of the contact hole; and depositing polycrystalline semiconductor material within the contact hole.

6. A method of manufacturing a semiconductor structure comprising:

providing a semiconductor layer stack comprising a semiconductor substrate of a first conductivity type, a heavily-doped buried layer of a second conductivity type and a monocrystalline semiconductor layer of a third conductivity type formed on top of the semiconductor substrate and the buried layer, the monocrystalline semiconductor layer having an upper surface forming a surface of the semiconductor structure;

forming a contact hole in the surface of the semiconductor structure so as to contact the buried layer, the contact hole having a first width and a first depth, the depth being measured from the surface of the semiconductor structure;

forming an isolation trench in the surface of the semiconductor structure so as to laterally insulate different portions of the semiconductor structure, the isolation trench having a second width and a second depth, the depth being measured from the surface of the semiconductor structure;

depositing a first polycrystalline semiconductor material of the second conductivity type within the contact hole and the isolation trench;

isotropicly etching the first polycrystalline semiconductor material such that the first polycrystalline semiconductor material remains within the contact hole, but is removed from within the isolation trench;

depositing a dielectric layer on the side walls and the bottom portion of the isolation trench and on the surface of the semiconductor structure;

depositing a second polycrystalline semiconductor material within the isolation trench; and removing the second polycrystalline semiconductor material and the dielectric layer from the surface of the semiconductor structure.

7. A method of manufacturing a semiconductor structure comprising:

providing a semiconductor layer stack comprising a semiconductor substrate of a first conductivity type, a heavily-doped buried layer of a second conductivity type and a monocrystalline semiconductor layer of a third conductivity type formed on top of the semiconductor substrate and the buried layer, the monocrystalline semiconductor layer having an upper surface forming a surface of the semiconductor structure;

forming a contact hole in the surface of the semiconductor structure so as to contact the buried layer, the contact hole having a first width and a first depth, the depth being measured from the surface of the semiconductor structure;

forming an isolation trench in the surface of the semiconductor structure so as to laterally insulate different portions of the semiconductor structure, the isolation trench having a second width and a second depth, the depth being measured from the surface of the semiconductor structure; and providing a contact to the semiconductor substrate within the isolation trench, wherein providing the contact to the semiconductor substrate comprises:

providing a dielectric layer at the side walls of the contact hole and of the isolation trench, leaving the bottom portions of the contact hole and the isolation trench uncovered;

depositing a metal layer at least on the bottom portions of the contact hole and of the isolation trench;

forming a metal-semiconductor compound at the bottom portions of the contact hole and of the isolation trench; and depositing a polycrystalline semiconductor material within the contact hole and the isolation trench.

8. The method of claim 7, wherein providing a dielectric layer, depositing a metal layer, forming a metal-semiconductor compound and depositing a polycrystalline semiconductor material are carried out simultaneously for the contact hole and the isolation trench.

9. The method of claim 7, wherein the metal layer is one of a group comprising Ti, W, Co, Ta, Hf, other transition metals and graphite.

10. A method of manufacturing a semiconductor structure comprising:

providing a semiconductor layer stack comprising a semiconductor substrate of a first conductivity type, a heavily-doped buried layer of a second conductivity type and a monocrystalline semiconductor layer of a third conductivity type formed on top of the semiconductor substrate and the buried layer, the monocrystalline semiconductor layer having an upper surface forming a surface of the semiconductor structure;

forming a contact hole in the surface of the semiconductor structure so as to contact the buried layer, the contact hole having a first width and a first depth, the depth being measured from the surface of the semiconductor structure;

forming an isolation trench in the surface of the semiconductor structure so as to laterally insulate different portions of the semiconductor structure, the isolation trench having a second width and a second depth, the depth being measured from the surface of the semiconductor structure; and providing a contact to the semiconductor structure within the isolation trench, wherein providing the contact to the semiconductor substrate comprises:

providing a dielectric layer at the side walls of the contact hole and of the isolation trench, leaving the bottom portions of the contact hole and of the isolation trench uncovered; and depositing a conductive material within the contact hole and the isolation trench.

11. The method of claim 10, wherein forming a dielectric layer and depositing a conductive material are carried out simultaneously for the contact hole and the isolation trench.

12. The method of claim 10, wherein the conductive material is one of a group comprising Ti, W, Co, Al, Cu, graphite, electrically conductive nitrides, carbides, silicides and transition metals compounds.

13. A method of manufacturing a semiconductor structure comprising:
- providing a semiconductor layer stack comprising a semiconductor substrate of a first conductivity type, a heavily-doped buried layer of a second conductivity type and a monocrystalline semiconductor layer of a third conductivity type formed on top of the semiconductor substrate and the buried layer, the monocrystalline semiconductor layer having an upper surface forming a surface of the semiconductor structure;
- forming an isolation trench in the surface of the semiconductor structure so as to laterally insulate different portions of the semiconductor structure, the isolation trench extending into the semiconductor substrate;
- providing an insulating layer at the side walls of the isolation trench, leaving the bottom portion of the isolation trench uncovered;
- providing a contact to the semiconductor substrate within the isolation trench;
- forming a contact structure in the surface of the semiconductor structure so as to contact the buried layer, the contact structure extending to the buried layer; and
- providing a contact to the buried layer within the contact structure;
- wherein providing the contact to the semiconductor substrate and providing the contact to the buried layer comprises:
  - providing an insulating layer at the side walls of the contact structure, leaving the bottom of the contact structure uncovered;
  - depositing a metal layer at least at the bottom portion of the contact structure;
  - forming a metal-semiconductor compound at the bottom portion of the contact structure; and
  - depositing a polycrystalline semiconductor layer of the first conductivity type within the isolation trench and within the contact structure.

14. The method of claim 13, wherein the metal layer is one of a group comprising Ti, W, Co, Ta, Hf, other transition metals and graphite.

15. A method of manufacturing a semiconductor structure comprising:
- providing a semiconductor layer stack comprising a semiconductor substrate of a first conductivity type, a heavily-doped buried layer of a second conductivity type and a monocrystalline semiconductor layer of a third conductivity type formed on top of the semiconductor substrate and the buried layer, the monocrystalline semiconductor layer having an upper surface forming a surface of the semiconductor structure;
- forming an isolation trench in the surface of the semiconductor structure so as to laterally insulate different portions of the semiconductor structure, the isolation trench extending into the semiconductor substrate;
- providing an insulating layer at the side walls of the isolation trench, leaving the bottom portion of the isolation trench uncovered;
- providing a contact to the semiconductor substrate within the isolation trench;
- forming a contact structure in the surface of the semiconductor structure so as to contact the buried layer, the contact structure extending to the buried layer; and
- providing a contact to the buried layer within the contact structure;
- wherein providing the contact to the semiconductor substrate and providing a contact to the buried layer comprise depositing a conductive material within the isolation trench and within the contact structure and wherein the conductive material comprises Ti, W, Co, Al, Cu, graphite, electrically conductive nitrides, carbides, silicides or transition metals compounds.

\* \* \* \* \*